(12) United States Patent
Kageyama

(10) Patent No.: US 9,614,126 B2
(45) Date of Patent: Apr. 4, 2017

(54) LIGHT EMITTING DEVICE

(71) Applicant: Nichia Corporation, Anan-shi, Tokushima (JP)

(72) Inventor: Hiroaki Kageyama, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/139,617

(22) Filed: Apr. 27, 2016

(65) Prior Publication Data

US 2016/0315225 A1    Oct. 27, 2016

(30) Foreign Application Priority Data

Apr. 27, 2015  (JP) .................. 2015-090368
Mar. 2, 2016   (JP) .................. 2016-039722

(51) Int. Cl.
*H01L 33/38*    (2010.01)

(52) U.S. Cl.
CPC .................. *H01L 33/38* (2013.01)

(58) Field of Classification Search
CPC .................................. H01L 33/385
See application file for complete search history.

(56) References Cited

U.S. PATENT DOCUMENTS

2012/0248405 A1*  10/2012  Tu ....................... H01L 33/44
                                                                257/13

FOREIGN PATENT DOCUMENTS

| JP | 2005-093970 A | 4/2005 |
|----|---------------|--------|
| JP | 2005-322722 A | 11/2005 |
| JP | 3878715 B2 | 2/2007 |
| JP | 2010-525586 A | 7/2010 |
| JP | 2011-192960 A | 9/2011 |
| JP | 2011-204964 A | 10/2011 |
| JP | 2012-134421 A | 7/2012 |
| JP | 5326957 B2 | 10/2013 |
| JP | 2014-022607 A | 2/2014 |
| JP | 2014-022608 A | 2/2014 |
| JP | 2014-022609 A | 2/2014 |
| JP | 2014-022610 A | 2/2014 |
| JP | 2014-150245 A | 8/2014 |
| JP | 2014-207267 A | 10/2014 |
| JP | 5777879 B2 | 9/2015 |
| WO | WO-2012/091042 A1 | 7/2012 |

* cited by examiner

*Primary Examiner* — Errol Fernandes
*Assistant Examiner* — Mounir Amer
(74) *Attorney, Agent, or Firm* — Foley & Lardner LLP

(57) ABSTRACT

A light emitting device includes a light emitting element, a p-side and an n-side post electrode. The light emitting element includes a semiconductor body having n-type and p-type semiconductor layers and a peripheral portion, a first edge, and a second edge. The light emitting element further includes an n-side electrode and a p-side electrode disposed on an insulating film having n-side openings and a p-side opening. The n-side electrode includes second n-contact portions electrically connected to the n-type semiconductor layer through the n-side openings. In a plan view, a p-side post electrode and at least one of the second n-contact portions are at the first edge side. An n-side post electrode electrically connected to the second n-contact portions and at least one of the second n-contact portions are at the second edge side. Fewer second n-contact portions are on the first edge side than that on the second edge side.

19 Claims, 15 Drawing Sheets

LIGHT EMITTING DEVICE

CROSS-REFERENCE TO RELATED PATENT APPLICATIONS

The present application claims priority to Japanese Patent Application No. 2015-90368 filed Apr. 27, 2015, and 2016-039722 filed Mar. 2, 2016, both of which are incorporated herein by reference in their entireties.

BACKGROUND

The present disclosure relates to a light emitting device.

A flip chip-mounted light emitting device has been proposed in which an insulating film with openings is disposed covering lateral surfaces of a p-type semiconductor layer that is above an n-type semiconductor layer, and an n-side electrode disposed on the insulating film is extended inside the openings and is in contact with lateral surfaces of the n-type semiconductor layer to establish electrical continuity (see, for example, JP 2014-22608 A).

In the light emitting device described in JP 2014-22608 A, a light emitting layer is formed on the n-type semiconductor layer and a p-type semiconductor layer is formed on the light emitting layer. Then, openings are formed through the p-type semiconductor layer into the n-type semiconductor layer, and a hole (hereinafter, referred to as a hole for a light emitting element) extending to the n-type semiconductor layer is formed. Then, an insulating tube layer is disposed in each of the openings, and a linear connection post portion of an electrically conductive member is formed in the insulating tube layer so as to connect with the n-type semiconductor layer. The upper end of the connection post portion is connected to the n-side electrode. That is, the n-side electrode is electrically connected to the n-type semiconductor layer through the connection post portions extending through the insulating tube layers formed in the openings of the insulating film that is formed under the n-side electrode.

SUMMARY

In certain embodiments, a light emitting device is provided in which an increase in forward voltage Vf in a light emitting element can be reduced while maintaining a light emitting intensity distribution in the surface of the light emitting element.

According to certain embodiments, a light emitting device includes a light emitting element including a semiconductor layered body, an insulating film, an n-side electrode, and a p-side electrode. The semiconductor layered body is substantially rectangular in a plan view and includes an n-type semiconductor layer and a p-type semiconductor layer disposed in a region excluding a peripheral edge portion of the n-type semiconductor layer and a portion within a region of the n-type semiconductor layer that is interior to the peripheral edge portion. The insulating film is disposed on the semiconductor layered body and includes at least one p-side opening disposed on the p-type semiconductor layer and a plurality of n-side openings disposed on the n-type semiconductor layer at the portion within the region that is interior to the peripheral edge portion. The n-side electrode is disposed so as to extend from the top of the insulating film to the peripheral edge portion of the n-type semiconductor layer and includes a first n-contact portion electrically connected to the n-type semiconductor layer at the peripheral edge portion and a plurality of the second n-contact portions electrically connected to the n-type semiconductor layer through the n-side openings. The p-side electrode is electrically connected to the p-type semiconductor layer through the p-side opening. A p-side post electrode and at least one of the second n-contact portions are disposed on a first edge side of the semiconductor layered body in the plan view. The p-side post electrode is disposed on the p-side electrode and electrically connected to the p-side electrode. An n-side post electrode and at least one of the second n-contact portions are disposed on a second edge side opposite to the first edge side in the plan view. The n-side post electrode is disposed on the n-side electrode and electrically connected to the second n-contact portions. The number of the second n-contact portions disposed on the first edge side is smaller than the number of the second n-contact portions disposed on second edge side in the plan view.

According to certain embodiments, a light emitting device includes a light emitting element including a semiconductor layered body, an insulating film, an n-side electrode, and a p-side electrode. The semiconductor layered body is substantially rectangular in a plan view and includes an n-type semiconductor layer and a p-type semiconductor layer disposed in a region excluding a peripheral edge portion of the n-type semiconductor layer and a portion within a region of the n-type semiconductor layer that is interior to the peripheral edge portion. The insulating film is disposed on the semiconductor layered body and includes at least one p-side opening disposed on the p-type semiconductor layer and a plurality of n-side openings disposed on the n-type semiconductor layer at the portion within the region interior to the peripheral edge portion. The n-side electrode is disposed so as to extend from the top of the insulating film to the peripheral edge portion of the n-type semiconductor layer and includes a first n-contact portion electrically connected to the n-type semiconductor layer at the peripheral edge portion and a plurality of the second n-contact portions electrically connected to the n-type semiconductor layer through the n-side openings. The p-side electrode is electrically connected to the p-type semiconductor layer through the p-side opening. A p-side post electrode and at least one of the second n-contact portions are disposed on a first edge side of the semiconductor layered body in the plan view, and the p-side post electrode is disposed on the p-side electrode and electrically connected to the p-side electrode. An n-side post electrode and at least one of the second n-contact portions is disposed on the second edge side opposite to the first edge side in the plan view, and the n-side post electrode is disposed on the n-side electrode and electrically connected to the second n-contact portion. The plurality of second n-contact portions are arranged so as to satisfy the relationship of $\beta > \alpha$ where $\alpha$ is a distance between a second n-contact portion closest to the first edge and the second edge of the semiconductor layered body, and $\beta$ is a distance between a second n-contact portion closest to the second edge and the first edge of the semiconductor layered body. The whole of the p-side post electrode is arranged between the second n-contact portion closest to the first edge and the peripheral edge portion.

In the light emitting device according to the embodiments of the present invention, an increase in forward voltage Vf can be reduced while maintaining a light emitting intensity distribution in the surface of a light emitting element.

BRIEF DESCRIPTION OF THE DRAWINGS

FIG. 7A shows a step of forming a whole-surface electrode, FIG. 7B shows a step of forming a cover electrode, and FIG. 7C shows a step of exposing an n-type semiconductor layer.

FIG. 8A shows a step of forming an insulating film, FIG. 8B shows a step of forming an n-side electrode, and FIG. 8C shows a step of forming a mask.

FIG. 9A shows a step of forming a post electrode and FIG. 9B shows a step of removing a mask.

DETAILED DESCRIPTION OF EMBODIMENTS

Figure 1:
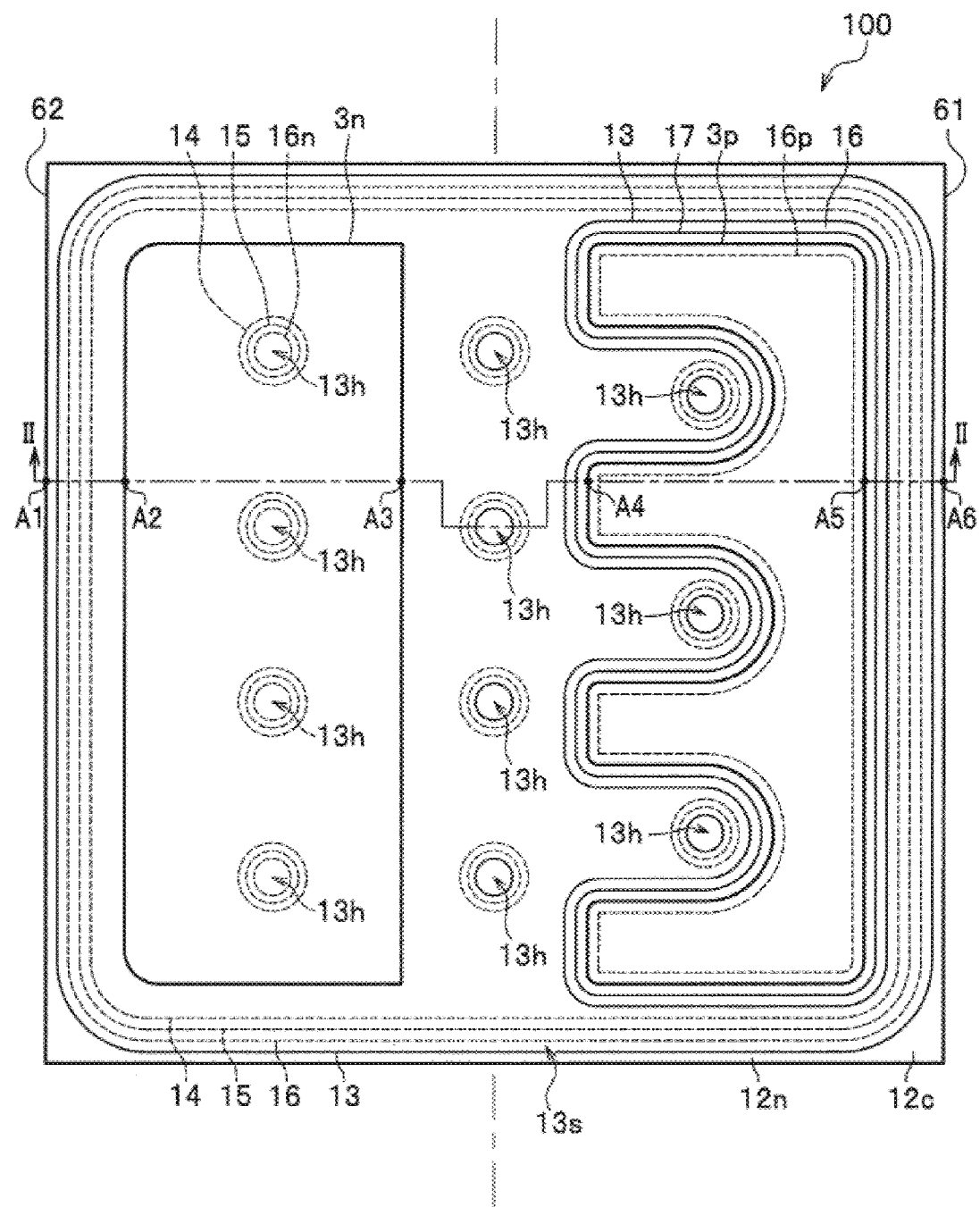
FIG. 1 is a plan view schematically showing a configuration of a light emitting device according to a first embodiment of the present invention.

Hereinafter, embodiments of light emitting devices according to the present invention will be described. In the drawings which are referred to in the descriptions below, certain embodiments of the present invention are schematically shown, and therefore the scales and intervals of the members may be exaggerated, or illustration of a part of the members may be omitted. There may be a mismatch in scale and interval of the members between a plan view and a cross-sectional view. Further, in the following description, like names and reference numbers generally show like members or members of like natures, and detailed descriptions thereof are appropriately omitted.

In the light emitting device according to each embodiment of the present invention, the positions of "upper", "lower", "left", "right" and the like are interchanged depending on a situation. In this specification, the position of "upper", "lower" or the like shows a relative position between constituent elements in the drawings to be referred to for explanation, and is not intended to show an absolute position unless otherwise specified.

First Embodiment

Configuration of Light Emitting Device

Figure 2:
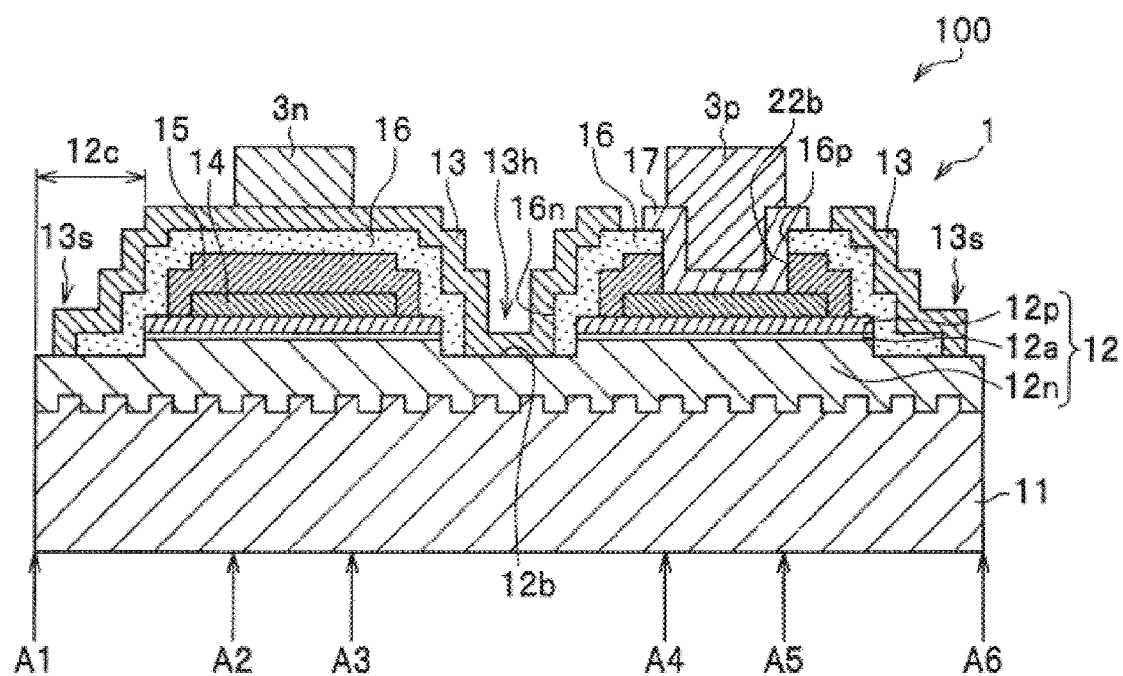
FIG. 2 is a cross-sectional view taken along line II-II in FIG. 1.

First, the configuration of the light emitting device according to the first embodiment of the present disclosure will be described with reference to FIGS. 1 to 6 and FIG. 13. The cross-sectional view of FIG. 2 schematically shows a cross-section taken along line II-II in the plan view shown in FIG. 1. Positions A1 to A6 on line II-II shown in FIG. 1 correspond to positions A1 to A6 shown by arrows in FIG. 2, but in order to facilitate easy understanding of the cross-sectional structure, relative distances (lengths of members) in the plan view in FIG. 1 are appropriately extended or shortened in the cross-sectional view in FIG. 2 so that the relative distances in FIG. 1 do not coincide with the relative distances in FIG. 2. Unless otherwise specified, in a similar manner as in FIG. 2, other cross-sectional views illustrated below are cross-sections corresponding to line II-II in the plan view in FIG. 1. In FIGS. 3 to 6 and FIG. 13, an arrangement region in a plan view is shown by hatching for each layer for explaining the stacked-layer structure of a light emitting device 100 according to the present embodiment.

The light emitting device 100 according to the present embodiment includes a light emitting element 1 having a light emitting diode (an LED) structure, and an n-side post electrode 3n and a p-side post electrode 3p each disposed on one surface of the light emitting element 1 as shown in FIGS. 1 to 6. In the light emitting device 100, the upper surfaces of the n-side post electrode 3n and the p-side post electrode 3p are mounting surfaces to be electrically connected to the outside. The lower surface of the light emitting element 1 is a light extraction surface. The light emitting device 100 is formed at a wafer level as described in detail below.

The configuration of each member of the light emitting device 100 will be described in detail below. The light emitting element 1 includes a substrate 11, a semiconductor layered body 12, a whole-surface electrode 14, a cover electrode 15, an insulating film 16, an n-side electrode 13 and a p-side electrode 17.

Substrate 11

The substrate 11 may be a substrate material on which a semiconductor can be epitaxially grown, and its size, thickness and so on are appropriately selected. Examples of the substrate material include insulating substrates of sapphire with any of a C-surface, a R-surface or an A-surface as a main surface or spinel ($MgAl_2O_4$), substrates of silicon carbide (SiC), silicon, ZnS, ZnO, Si, GaAs or diamond, and oxide substrates that lattice matches with a semiconductor, such as lithium niobate and neodymium gallate. In the present embodiment, in view of improving the light extraction efficiency of the light emitting device 100, a light transmissive sapphire substrate is preferably used.

Semiconductor Stacked-Layer Body 12

The semiconductor layered body 12 is a layered body stacked on the substrate 11, and includes an n-type semiconductor layer 12n, an active layer 12a and a p-type semiconductor layer 12p in this order from the substrate 11 side. The p-type semiconductor layer 12p and the active layer 12a are disposed on the n-type semiconductor layer 12n in a region excluding a peripheral edge portion 12c and a portion within a region that is interior to the peripheral edge portion 12c. For the n-type semiconductor layer 12n, the active layer 12a, and the p-type semiconductor layer 12p, semiconductors such as $In_XAl_YGa_{1-X-Y}N$ (0≤X, 0≤Y, X+Y<1) can be suitably used. These semiconductor layers may each have a single-layer structure, or have a layered structure including layers having different compositions, thicknesses and so on, a super lattice structure, or the like. In particular, the active layer 12a preferably has a single quantum well structure or a multiple quantum well structure that is made of stacked layer of thin layers that each can produce a quantum effect.

The semiconductor layered body 12 is substantially rectangular in a plan view, and includes a peripheral edge portion 12c and holes 12b as shown in FIG. 2.

The peripheral edge portion 12c is a residual portion of a cutting margin for singulating the light emitting elements 1 in a wafer state, disposed along boundary lines of the light emitting elements 1 in a wafer state. In the peripheral edge portion 12c, the p-type semiconductor layer 12p and the active layer 12a are not disposed, and the n-type semiconductor layer 12n is exposed. Hereinafter, the peripheral edge portion 12c of the semiconductor layered body 12 may be also referred to as the peripheral edge portion 12c of the n-type semiconductor layer 12n. In the light emitting element 1, the lateral side surfaces of the p-type semiconductor layer 12p and the active layer 12a that are exposed after forming the peripheral edge portion 12c of the semiconductor layered body 12 are covered by the insulating film 16. The peripheral edge portion 12c of the semiconductor layered body 12 is covered by the n-side electrode 13 and the insulating film 16, but is partially exposed.

As shown in FIG. 2, the boundary between the peripheral edge portion 12c of the n-type semiconductor layer 12n and the p-type semiconductor layer 12p is covered by the n-side electrode 13 and the insulating film 16, and is not covered by the cover electrode 15. This indicates that in the plan view in FIG. 1, a boundary line between the peripheral edge portion 12c and the p-type semiconductor layer 12p exists between a line showing the peripheral edge of the cover electrode 15 and a line showing the peripheral edge of the insulating film 16 in the vicinity of each edge of the rectangular semiconductor layered body 12, but in FIG. 1, the boundary line is omitted for improving the visibility of other lines of the site. For other plan views (FIG. 5, FIG. 6, FIG. 10, FIG. 11, FIG. 12 and FIG. 13), the boundary line between the peripheral edge portion 12c and the p-type semiconductor layer 12p exists between a line showing the peripheral edge of the cover electrode 15 and the peripheral edge of the insulating film 16, but illustration of the boundary line is omitted.

The holes 12b of the semiconductor layered body 12 are disposed in a region at interior to the peripheral edge portion 12c. The light emitting element 1 is disposed with a plurality of holes 12b (see FIG. 5 and FIG. 6). In the holes 12b, the p-type semiconductor layer 12p, the active layer 12a and a part of the n-type semiconductor layer 12n are removed from the top of the n-type semiconductor layer 12n. At the bottom surface of the holes 12b, the n-type semiconductor layer 12n is exposed from the p-type semiconductor layer 12p and the active layer 12a. The lateral side surfaces of the holes 12b are covered by the insulating film 16. The bottom surface of each of the holes 12b is partially covered by the insulating film 16 in the form of a circular ring, and the n-side electrode 13 is disposed in the circular ring. That is, the n-side electrode 13 and the n-type semiconductor layer 12n are in contact with each other and electrically connected to each other through an n-side opening 16n of the insulating film 16 disposed on a part of the bottom surface of each of the holes 12b. The holes 12b may be formed in, for example, a circular shape or an elliptic shape in top view.

As shown in FIG. 2, the boundary between each of the holes 12b of the semiconductor layered body 12 and the p-type semiconductor layer 12p is covered by the n-side electrode 13 and the insulating film 16, and is not covered by the cover electrode 15. This indicates that in the plan view in FIG. 1, a boundary line between each of the holes 12b and the p-type semiconductor layer 12p exists between a line showing the peripheral edge of the cover electrode 15 and a line showing the peripheral edge of the insulating film 16 in the vicinity of a second n-contact portion 13h as described later, but in FIG. 1, the boundary line is omitted for improving the visibility of other lines of the site. For other plan views (FIG. 5, FIG. 6, FIG. 10, FIG. 11, FIG. 12 and FIG. 13), the boundary line between each of the holes 12b and the p-type semiconductor layer 12p exists between a line showing the peripheral edge of the cover electrode 15 and the peripheral edge of the insulating film 16, but illustration of the boundary line is omitted.

In the case of forming the semiconductor layered body 12 in a substantially square shape in a plan view, the dimension of one side may be, for example, in a range of 300 to 3000 μm, preferably in a range of 500 to 1500 μm. In the case where the shape of the hole 12b of the semiconductor layered body 12 is, for example, a circular shape in top view, the diameter of the hole 12b can be appropriately set in accordance with the size of the semiconductor layered body 12. With a smaller diameter of the hole 12b, the region where the active layer 12a etc. is partially removed can be reduced, so that the light emitting region can be increased. With a smaller diameter of the hole 12b formed on a first edge 61 side, the region of the p-side post electrode 3p can be easily widened, so that mountability can be improved. With a larger diameter of the hole 12b, the contact area between the n-side electrode 13 and the n-type semiconductor layer 12n can be increased, so that an increase in forward voltage Vf can be reduced. The lower limit of the diameter of the hole 12b may be set in such a manner that the hole 12b can be accurately produced by etching. The upper limit of the diameter of the hole 12b may be set in such a manner that desired light emission can be maintained even when the active layer 12a etc. is partially removed to form the hole 12b. One example of the diameter may be, for example, in a range of 5 to 150 μm, preferably in a range of 20 to 100 μm. The width of the region exposed from the n-side electrode 13 in the peripheral edge portion 12c of the semiconductor layered body 12 corresponds to approximately half of the width of a dicing street at the time of singulating the light emitting devices from a wafer, and can be appropriately set according to the size of the semiconductor layered body 12. The width of the region exposed from the n-side electrode 13 in the peripheral edge portion 12c of the semiconductor layered body 12 may be, for example, in a range of 10 to 150 μm, preferably in a range of 20 to 100 μm.

Whole-Surface Electrode 14

Figure 3:
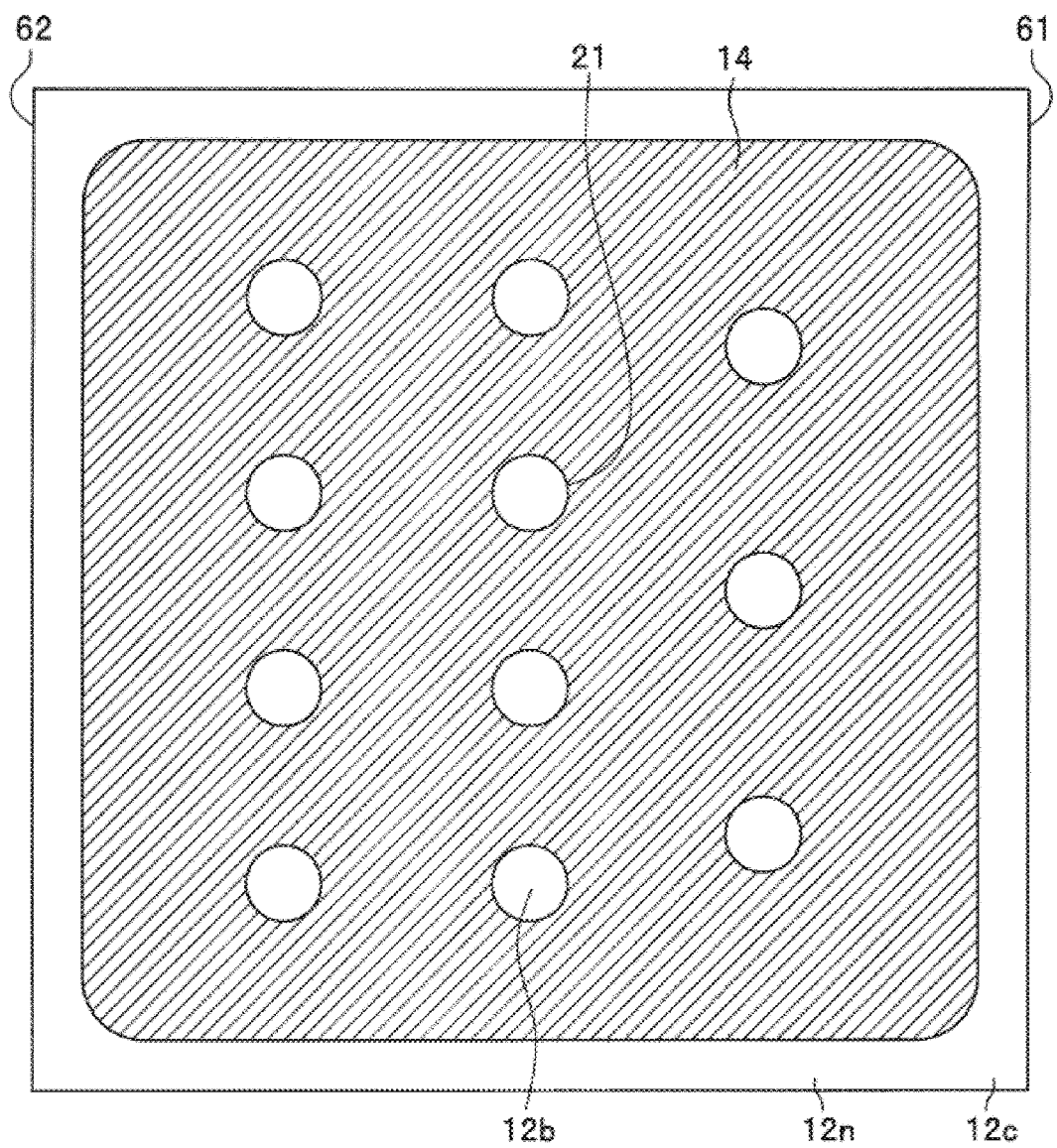
FIG. 3 is an explanatory view schematically showing a region where a whole-surface electrode is disposed in the light emitting device in FIG. 1.

The whole-surface electrode 14 is disposed so as to cover substantially the whole of the upper surface of the p-type semiconductor layer 12p as shown in FIG. 2 and FIG. 3. In FIG. 3, the hatched region shows a finished shape of the whole-surface electrode 14. The whole-surface electrode 14 defines a total of eleven openings 21 at positions corresponding to the holes 12b of the n-type semiconductor layer 12n. FIG. 3 is a plan view showing a state after completion of a step of exposing the n-type semiconductor layer to be described below (see FIG. 7C). At this time, the cover electrode 15 covering the whole-surface electrode 14 is formed, but FIG. 3 shows a state in which the cover electrode 15 is not included. Further, at this time, the boundary line between the peripheral portion 12c of the semiconductor layered body 12 and the p-type semiconductor layer 12p and the boundary line between the holes 12b and the p-type semiconductor layer 12p exist, but are not included in FIG. 3.

The whole-surface electrode 14 is a layer for diffusing a current, which is supplied through the p-side electrode 17, to the whole surface of the p-type semiconductor layer 12p. The whole-surface electrode 14 has good light reflectivity, and also serves as a layer to reflect light emitted by the light emitting element 1 downward to a light extraction surface.

For the whole-surface electrode 14, a metal material having good electrical conductivity and light reflectivity can be used. As a metal material having good reflectively, particularly in the visible region, Ag, Al, Ni, Ti, Pt or an alloy mainly composed of any of these metals can be suitably used. For the whole-surface electrode 14, a single layer or a multi-layer of these metal materials can be used.

Cover Electrode 15

Figure 4:
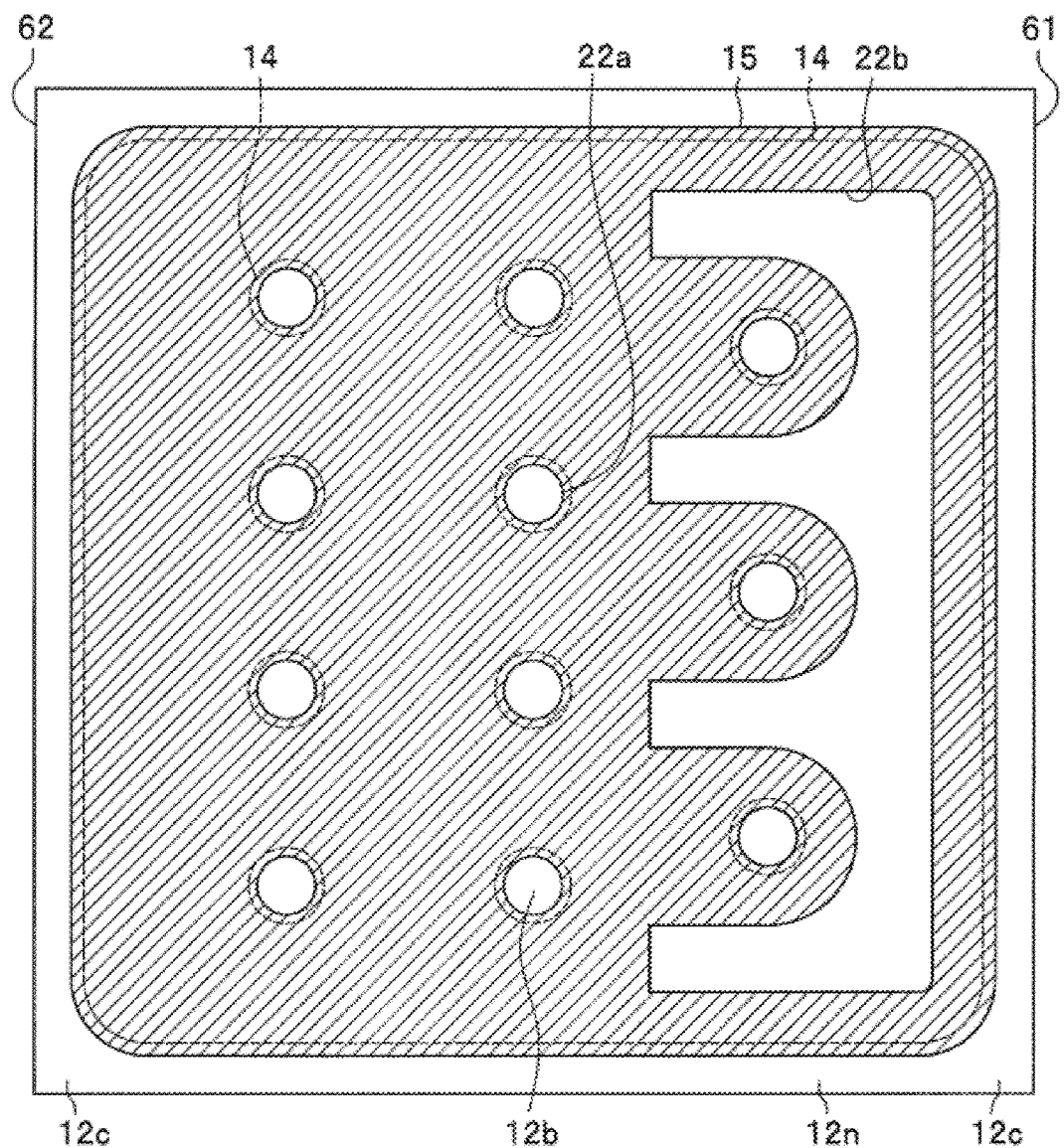
FIG. 4 is an explanatory view schematically showing a region where a cover electrode is disposed in the light emitting device in FIG. 1.

As shown in FIG. 2 and FIG. 4, the cover electrode 15 is disposed to cover the lateral side surfaces and a portion of the upper surface of the whole-surface electrode 14. In FIG. 4, the hatched region shows a finished shape of the cover electrode 15. The cover electrode 15 defines a total of eleven openings 22a at positions corresponding to the holes 12b of the n-type semiconductor layer 12n, and an opening 22b formed at a position corresponding to the p-side electrode 17. The p-side electrode 17 is disposed in the opening 22b defined in the cover electrode 15 and a p-side opening 16p defined in the insulating film 16, and is in contact with the whole-surface electrode 14, and thus electrically connected to the whole-surface electrode 14.

FIG. 4 shows an arrangement of the cover electrode 15 formed under the insulating film 16 after completion of a step of forming an insulating film to be described below (see FIG. 8A). At this time, a boundary line between the peripheral edge portion 12c of the semiconductor layered body 12 and the p-type semiconductor layer 12p, and a boundary line between the hole 12b and the p-type semiconductor layer 12p exist, but are not included in FIG. 4. As shown in FIG. 7C, the p-type semiconductor layer 12p is left with a wider area than the cover electrode 15.

The cover electrode 15 is a barrier layer to reduce the migration of the metal material that forms the whole-surface electrode 14. For the cover electrode 15, a metal oxide or metal nitride having a barrier property can be used. For example, an oxide or nitride of at least one selected from the group consisting of Si, Ti, Zr, Nb, Ta and Al can be used. For the cover electrode 15, a single layer or a stacked layer of these metal materials can be used. The cover electrode 15 is disposed at slightly inner side than the p-type semiconductor layer 12p. In the present embodiment, SiN having insulating properties is used for the cover electrode 15.

Insulating Film 16

The insulating film 16 is an interlayer insulating film which is disposed over the semiconductor layered body 12, and serves as a protective film and antistatic film for the light emitting element 1. For the insulating film 16, a metal oxide or metal nitride can be used. For example, an oxide or nitride of at least one selected from the group consisting of Si, Ti, Zr, Nb, Ta and Al can be preferably used. Also, as the insulating film 16, two or more light-transmissive dielectric materials having different refractive indexes may be stacked to form a Distributed Bragg Reflector (DBR) film.

Figure 5:
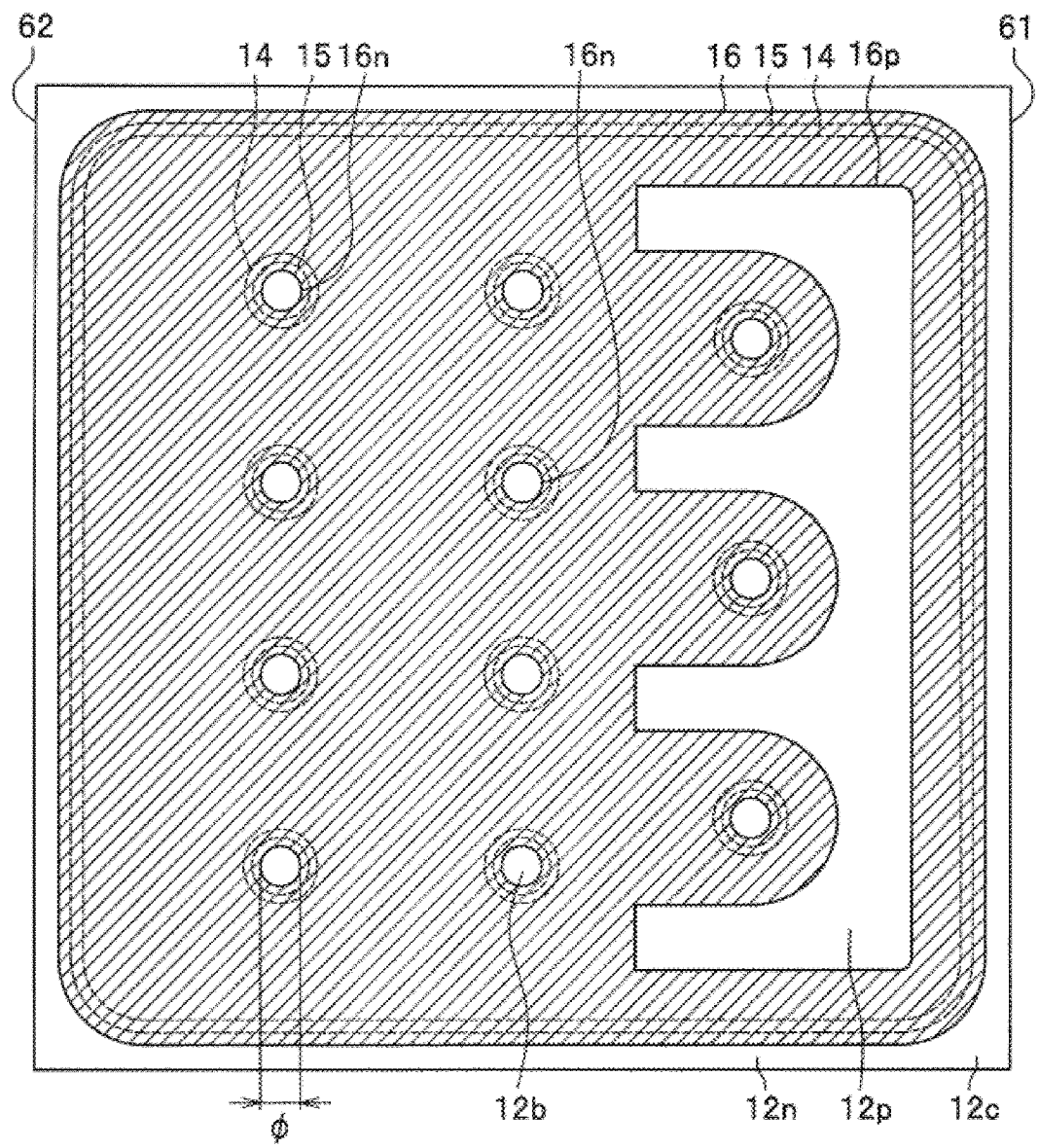
FIG. 5 is an explanatory view schematically showing a region where an insulating film is disposed in the light emitting device in FIG. 1.

As shown in FIG. 2 and FIG. 5, the insulating film 16 is disposed on the lateral side surfaces and a portion of the upper surface of the cover electrode 15, and the upper surface and the lateral side surfaces of the semiconductor layered body 12. That is, the hatched region in FIG. 5 shows a finished shape of the insulating film 16. FIG. 5 is a plan view showing a state after completion of a step of forming the insulating film to be described below (see FIG. 8A).

The insulating film 16 is disposed on a portion of the peripheral edge portion 12c of the n-type semiconductor layer 12n. The n-side electrode 13 is in contact with and electrically connected to the n-type semiconductor layer 12n at an outer side relative to the insulating film 16 disposed on the peripheral edge portion 12c of the n-type semiconductor layer 12n. The insulating film 16 has the p-side opening 16p over the p-type semiconductor layer 12p. The p-side opening 16p is formed in a comb shape in a region where the p-side electrode 17 to be disposed. In one example, the p-side opening 16p is formed in conformity with the opening 22b of the cover electrode 15 in a plan view (see FIG. 4). The insulating film 16 further has the n-side openings 16n at the bottom of the holes 12b of the n-type semiconductor layer 12n. The n-side openings 16n are formed in, for example, a circular shape at the bottom of each of the holes 12b formed at eleven positions.

In the case where the n-side openings 16n are circular, the diameter $\phi$ of the openings can be appropriately set according to the diameter of the holes 12b and within a range smaller than the diameter of the holes 12b of the n-type semiconductor layer 12n. With the diameter $\phi$ of the n-side openings 16n, for example, in a range of 3 μm to 150 μm, preferably in a range of 15 μm to 100 μm, the region where the active layer 12a etc. is removed can be reduced and the region of the p-side post electrode 3p can be increased, so that mountability can be improved.

N-Side Electrode 13 and P-Side Electrode 17

Figure 6:
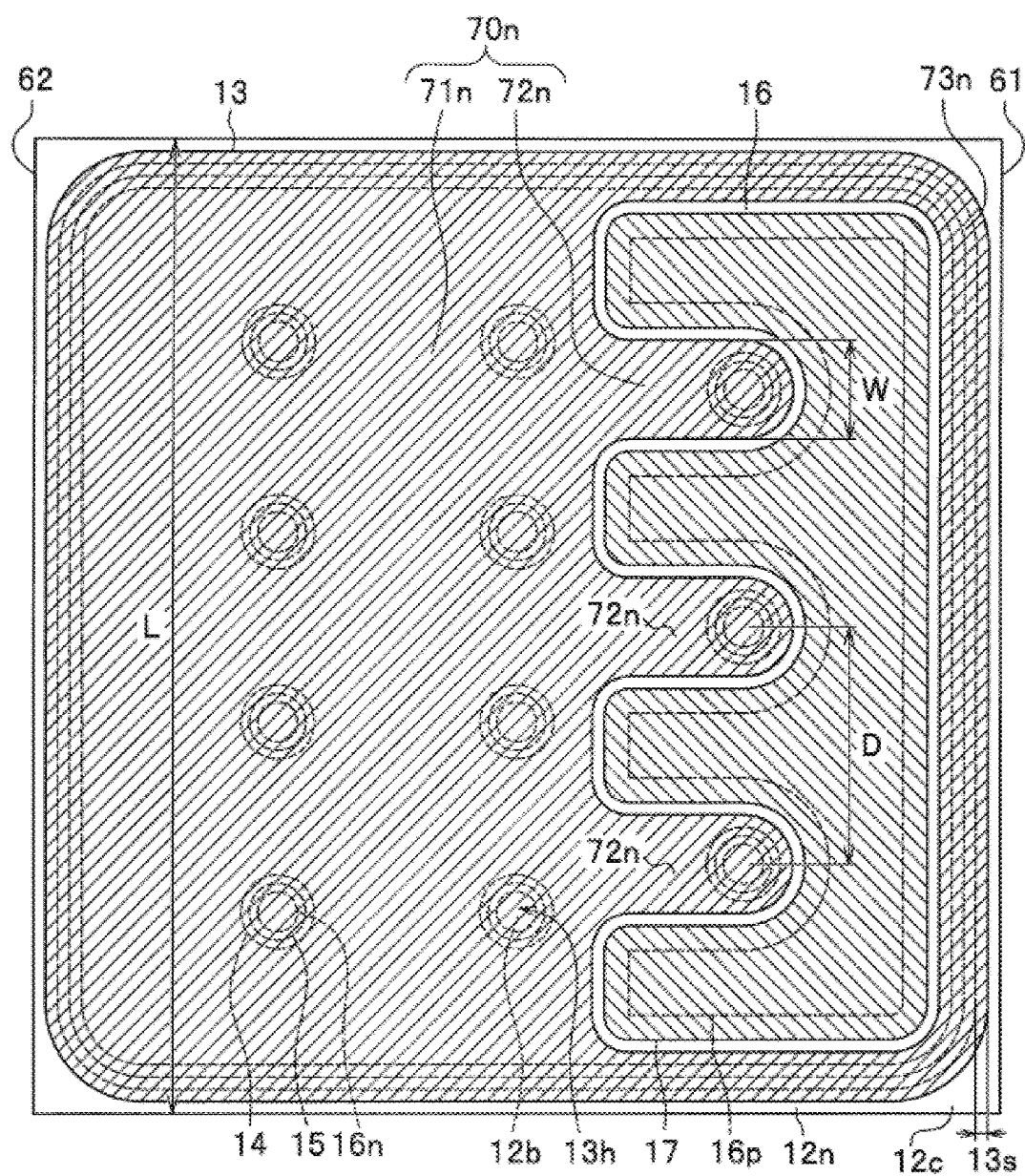
FIG. 6 is an explanatory view schematically showing regions where an n-side electrode and a p-side electrode are disposed in the light emitting device in FIG. 1.

In FIG. 6, the n-side electrode 13 is shown by right-up hatching and the p-side electrode 17 is shown by right-down hatching. FIG. 6 is a plan view showing a state after completion of a step of forming a pad electrode to be described below (see FIG. 8B). In FIG. 6, a portion of the peripheral edge portion 12c of the n-type semiconductor layer 12n is exposed, but during manufacture, a portion of the peripheral edge portion 12c that serves as the boundary line between light emitting elements in a wafer state is covered by the material of the n-side electrode 13.

The n-side electrode 13 is a pad electrode of the n-side of the light emitting element 1. As shown in FIG. 2 and FIG. 6, the n-side electrode 13 is disposed continuously on the insulating film 16, the peripheral edge portion 12c of the n-type semiconductor layer 12n, and the bottom surfaces defining the holes 12b. The n-side electrode 13 includes a first n-contact portion 13s which is in conduction with the n-type semiconductor layer 12n at the peripheral edge portion 12c, and a second n-contact portion 13h which is in conduction with the n-type semiconductor layer 12n at the bottom surface of the holes 12b.

In the present embodiment, the second n-contact portions 13h are disposed at eleven positions, and are respectively electrically connected to the n-type semiconductor layer 12n through the n-side openings 16n of the insulating film 16. More specifically, the second n-contact portions 13h are located in the bottom of the n-side openings 16n of the insulating film 16 in the holes 12b, and are electrically connected to the n-type semiconductor layer 12n, respectively. As described above, the n-side electrode 13 is electrically connected to the n-type semiconductor layer 12n in a large area on the surface of the light emitting element 1, so that a current supplied through the n-side electrode 13 can be diffused to the n-type semiconductor layer 12n, and thus the light emission efficiency can be improved.

Figure 13:
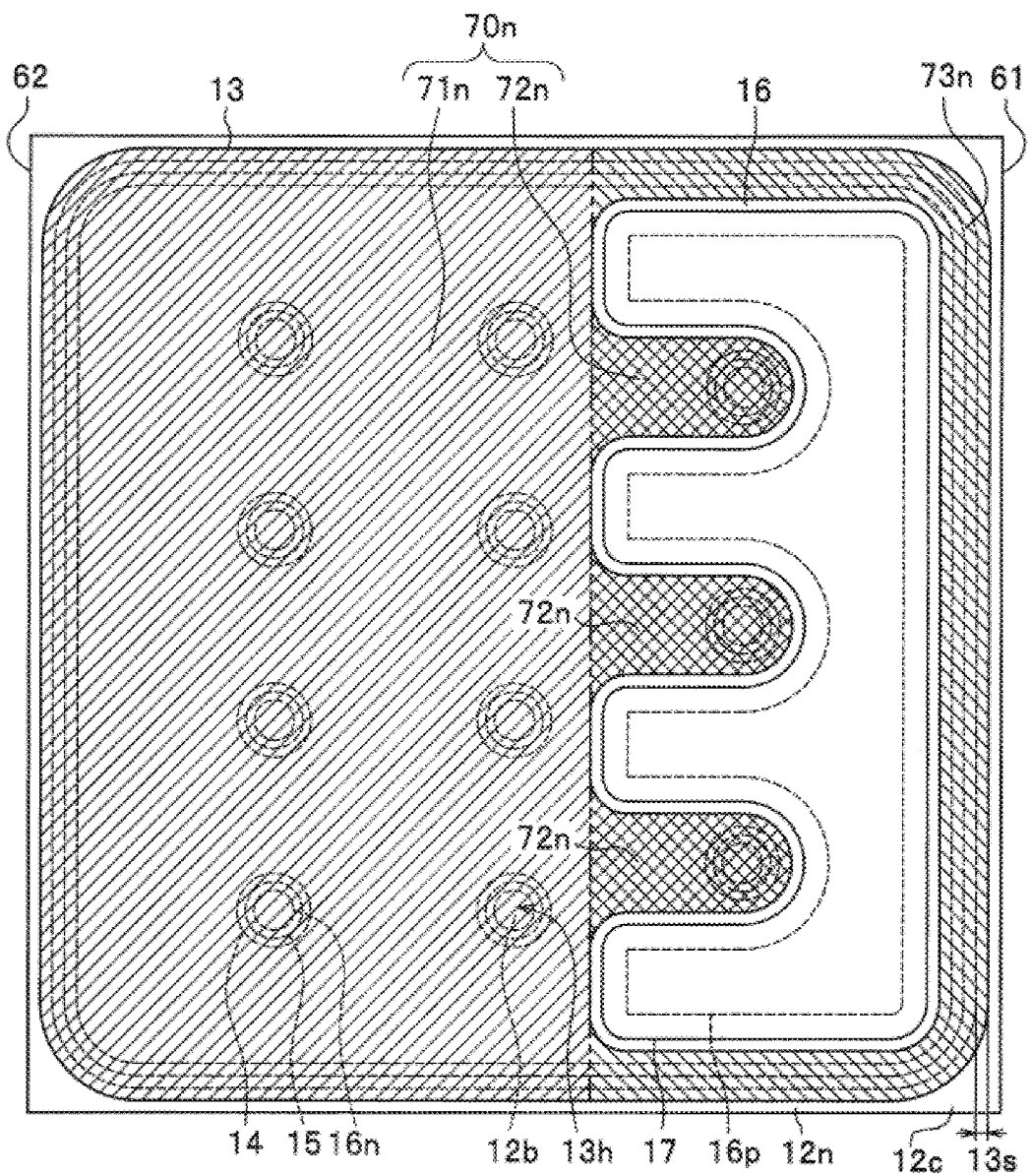
FIG. 13 is an explanatory view schematically showing a region where the n-side electrode is disposed in the light emitting device in FIG. 1.

In the present embodiment, as shown in FIG. 6 and FIG. 13, the n-side electrode 13 includes an n-side comb-shaped portion 70n and a peripheral wall portion 73n. In FIG. 13, the peripheral wall portion 73n is shown by right-down hatching. The n-side comb-shaped portion 70n includes the second n-contact portions 13h, and is disposed in a comb shape extended from a second edge 62 side towards the first edge 61 side of the semiconductor layered body 12. The peripheral wall portion 73n includes the first n-contact portion 13s, and continuously extends from the n-side comb-shaped portion 70n. The peripheral wall portion 73n is formed along the first edge 61 of the semiconductor layered body 12. In the present embodiment, the first n-contact portion 13s is formed in an approximately rectangular ring shape on the peripheral edge portion 12c of the semiconductor layered body 12 which is substantially rectangular in a plan view. Accordingly, the contact area between the n-side electrode 13 and the n-type semiconductor layer 12n increases, so that an increase in forward voltage Vf can be reduced even if the number of second n-contact portions 13h is decreased. On the other hand, simply reducing the number of second n-type contact portions 13h reduces the contact area between the n-side electrode 13 and the n-type semiconductor layer 12n, which may result in an increase in forward voltage Vf. Also, the current is likely to be unevenly distributed, so that the light emitting intensity distribution on the light emitting surface of the light emitting element 1 may be deteriorated. However, according to the present embodiment, the first n-contact portion 13s is provided, so that the arrangement, the number, or the like of the second n-contact portions 13h can be relatively easily changed while reducing the increase of the forward voltage Vf, which can facilitate an improvement in the light emitting intensity distribution on the light emitting surface of the light emitting element 1.

The n-side comb-shaped portion 70n includes a base portion 71n and a plurality of extended portions 72n. In FIG. 13, the region shown by right-up hatching is a region with the base portion 71n, and the region shown by cross-hatching is a region with the extended portions 72n. The base portion 71n is arranged at the second edge 62 side. The base portion 71n is arranged in a region absent of the p-side post electrode 3p. In the present embodiment, the base portion 71n has a longitudinally extending substantially rectangular shape in a plan view as shown in FIG. 6 and FIG. 13.

The extended portion 72n extends from the base portion 71n toward the first edge 61, and is electrically connected to the n-type semiconductor layer 12n through the second n-contact portions 13h arranged at the first edge 61 side. As shown in FIG. 6 and FIG. 13, the extended portion 72n is arranged so as to not overlap the p-side post electrode 3p in a plan view, and the second n-contact portions 13h are arranged at a tip side of the extended portion 72n that are proximate to the first edge 61.

In the extended portion 72n, the length in a direction parallel to the first edge 61 of the semiconductor layered body 12 (hereinafter referred to as a "width") in the extended portion 72n can be appropriately set. For example, in the case where each of the extended portions 72n has a shape in which the width in the base end side is smaller than the width in the tip side where the second n-contact portion 13h is arranged, the region for arranging the p-side post electrode 3p can be easily increased, so that the mountability of the light emitting device 100 can be improved. On the other hand, in the case where each of the extended portions 72n has the same width at the tip side and the base end side as shown in the figures, concentration of currents can be reduced at a site where the extended portion 72n is narrowed as compared to the shape in which the width at the base end side is smaller as described above. As a result, current can be efficiently supplied to the second n-contact portions 13h arranged on the tip sides of the extended portions 72n. Accordingly, in order to improve the light emitting intensity distribution on the light emitting surface of the light emitting element 1, the width W of each of a plurality of extended portions 72n is preferably substantially uniform from the base end side to the tip side.

In the case where the width of each of a plurality of extended portions 72n is made substantially uniform from the base end side to the tip side, the width of the extended portion 72n is preferably in a range of $\frac{1}{100}$ to $\frac{1}{3}$, more preferably in a range of $\frac{1}{50}$ to $\frac{1}{5}$, with respect to the length of the semiconductor layered body in a direction parallel to the first edge 61 of the semiconductor layered body 12. This arrangement allows for an increase in the region of the p-side post electrode 3p, which leads to improve mountability, while improving the light emitting intensity distribution on the light emitting surface of the light emitting element 1.

In a plan view, the plurality of extended portions 72n are preferably arranged at equal intervals in a direction substantially parallel to the first edge 61 of the semiconductor layered body 12. In other words, as shown in FIG. 6, the plurality of extended portions 72n are preferably arranged at a uniform interval D. In the present specification, the term "interval D" of extended portions 72n means a distance between the centers of two adjacent extended portions 72n. Each of the extended portions 72n is electrically connected to the n-type semiconductor layer 12n through the corresponding second n-contact portion 13h. Thus, with this arrangement, the current supplied to the n-type semiconductor layer 12n through the n-side electrode 13 can be uniformly distributed in the direction substantially parallel to the first edge 61 of the semiconductor layered body 12, so that the light emitting intensity distribution on the light emitting surface of the light emitting element 1 can be improved.

As shown in FIG. 6 and FIG. 13, the plurality of extended portions 72n preferably have the same shape in a plan view. Accordingly, in a direction parallel to the first edge 61 of the semiconductor layered body 12, the current supplied through the n-side electrode 13 can be uniformly distributed to the n-type semiconductor layer 12n, so that the light emitting intensity distribution on the light emitting surface of the light emitting element 1 can be improved.

The p-side electrode 17 is a pad electrode at the p-side of the light emitting element 1. As shown in FIG. 2 and FIG. 6, the p-side electrode 17 extends in the p-side opening 16p and the opening 22b of the cover electrode 15 in the right-side region of FIG. 6. The p-side electrode 17 is electrically connected to the whole-surface electrode 14 through the p-side opening 16p and the opening 22b of the cover electrode 15, and is electrically connected to the p-type electrode layer 12p through the whole-surface electrode 14. In a plan view, the p-side electrode 17 is formed in a comb shape similar to that of the p-side opening 16p and in a size that is slightly larger than the size of the p-side opening 16p or the opening 22b of the cover electrode 15.

For the n-side electrode 13 and the p-side electrode 17, a metal material can be used. For example, a single metal such as Ag, Al, Ni, Rh, Au, Cu, Ti, Pt, Pd, Mo, Cr or W, or an alloy mainly composed of those metals can be suitably used. In the case of using an alloy, a non-metal element such as Si may be contained as a composition element, as for example in an alloy of AlSiCu (hereinafter, referred to as ASC). For the n-side electrode 13 and p-side electrode 17, a single layer or a stacked layer of those metal materials can be used.

N-Side Post Electrode 3n and P-Side Post Electrode 3p

As shown FIG. 1 and FIG. 2, the n-side post electrode 3n is disposed on the n-side electrode 13 and is electrically connected to the second n-contact portion 13h. The p-side post electrode 3p is disposed on the p-side electrode 17 and is electrically connected to the p-side electrode 17 as shown FIGS. 1 and 2. The n-side post electrode 3n and the p-side post electrode 3p also serve as a heat conduction path for releasing heat generated by the light emitting element 1.

For the material of the n-side post electrode 3n and the p-side post electrode 3p, a metal such as Cu, Au or Ni can be suitably used. The n-side post electrode 3n and the p-side post electrode 3p can be formed by using an electroplating method. Details of a method for forming the n-side post electrode 3n and the p-side post electrode 3p will be described below.

At the time of mounting, a bonding member is applied between the n-side post electrode 3n and an outside wiring pattern and between the p-side post electrode 3p and the outside wiring pattern, and after the bonding member is melted, cooling is performed to firmly bond the n-side post electrode 3n and the p-side post electrode 3p with the outside wiring pattern. For the bonding member, solder of Sn—Au, Sn—Cu, Sn—Sg—Cu or the like can be used. In this case, the uppermost layers of the n-side post electrode 3n and the p-side post electrode 3p are preferably made of a material which can obtain satisfactory adhesion with a bonding member.

In the light emitting device 100 having the above-described configuration, as shown in FIG. 1, the n-side electrode 13 has the first n-contact portion 13s. By adjusting the width, the location, the area and so on of the first n-contact portion 13s, the contact area between the n-side electrode 13 and the n-type semiconductor layer 12n can be easily reliably obtained without increasing the number of holes 12b of the semiconductor layered body 12 (the number of second n-contact portions 13h) or increasing the diameter of the hole 12b of the semiconductor layered body 12 (the diameter of the second n-contact portion 13h). Accordingly, an increase in forward voltage Vf of the light emitting element 1 can be reduced and the light emitting output can be improved. In the present embodiment, the first n-contact portion 13s is arranged on the whole periphery of the semiconductor layered body 12, but a region, a part of which is not in contact with the n-type semiconductor layer 12n may exist as long as the effect of reducing the forward voltage Vf is not reduced.

In addition, in a plan view, the light emitting device 100 has the p-side post electrode 3p and the second n-contact portion 13h on the first edge 61 side of the semiconductor layered body 12, and the n-side post electrode 3n and the second n-contact portion 13h on the second edge 62 side that is opposite to the first edge 61 with respect to the center line that is substantially in parallel to the first edge of the semiconductor layered body 12. The light emitting device 100 is configured such that, in a plan view, the number of second n-contact portions 13h arranged on the first edge 61 side is smaller than the number of second n-contact portions 13h arranged on the second edge 62 side. Therefore, in a plan view, compared to a case where the same number of second n-contact portions 13h are arranged on both sides, the area of the p-side post electrode 3p disposed on the first edge 61 side can be widened, so that the mountability of the light emitting device 100 can be improved. In the present specification, the number of second n-contact portions 13h disposed on the first edge 61 side or on the second edge 62 side refers to the number of second n-contact portions 13h disposed on the first edge 61 side or on the second edge 62 side with respect to the center line of the semiconductor layered body 12, which is substantially parallel to the first edge 61. The number of second n-contact portions 13h disposed on the center line of the semiconductor layered body 12 is not involved.

Operation of the Light Emitting Device

Next, with reference to FIG. 1 and FIG. 2, operation of the light emitting device 100 will be described. In the light emitting device 100, when an external power supply is connected through a mounting substrate to the n-side post electrode 3n and the p-side post electrode 3p that are positive and negative electrodes for connecting to the outside, a current is supplied between the n-side electrode 13 and the p-side electrode 17 of the light emitting element 1 through the n-side post electrode 3n and the p-side post electrode 3p. Upon being supplied with current between the n-side electrode 13 and the p-side electrode 17, the active layer 12a of the light emitting element 1 emits light.

Light emitted by the active layer 12a of the light emitting element 1 propagates through the semiconductor layered body 12, and emitted from the lower surface or side surface of the light emitting element 1 (see FIG. 2) to the outside. Light propagating in upward direction in the light emitting element 1 is reflected by the whole-surface electrode 14, and emitted from the lower surface of the light emitting element 1 to the outside.

Method of Manufacturing the Light Emitting Device

Next, a method of manufacturing the light emitting device 100 shown in FIG. 1 will be described with reference to FIGS. 7A to 9B (see FIGS. 1 to 6 appropriately). The method of manufacturing the light emitting device 100 includes a step of forming a semiconductor layered body, a step of forming a whole-surface electrode, a step of forming a cover electrode, a step of exposing an n-type semiconductor layer, a step of forming an insulating film, a step of forming a pad electrode, a step of forming a mask, a step of forming a post electrode, a step of removing a mask, and a step of singulating, which are carried out in this order.

In FIGS. 7A to 9B, the shape, size and positional relation for the members may be simplified or exaggerated. In the manufacturing the light emitting device 100, the steps are carried out at wafer level with a large number of light emitting elements arranged two-dimensionally. As in the cross-sectional view of FIG. 2, the cross-sectional views of FIGS. 7A to 9B each corresponds to a cross-sectional view taken along the line II-II in FIG. 1.

First, in the step of forming a semiconductor layered body, the semiconductor layered body 12 is formed by sequentially stacking the n-type semiconductor layer 12n, the active layer 12a and the p-type semiconductor layer 12p on the upper surface of the substrate 11 made of sapphire etc., using the above-mentioned semiconductor materials.

Figure 7A:
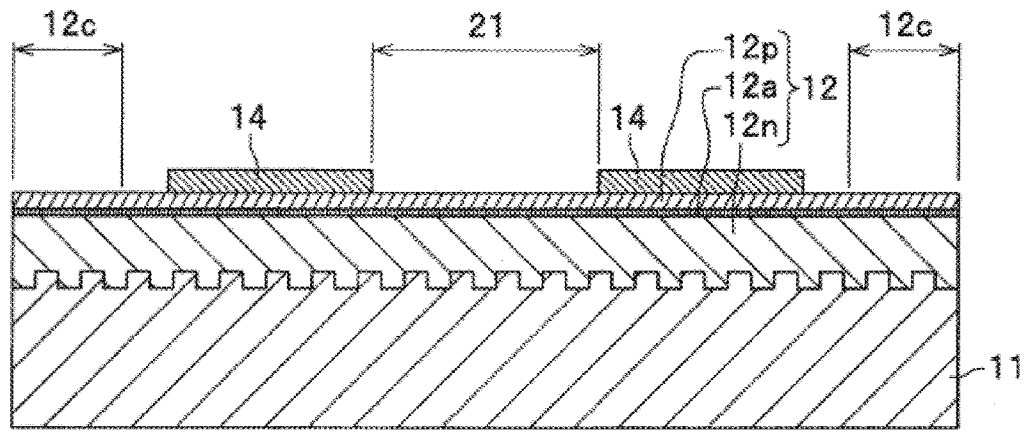
FIGS. 7A, 7B and 7C are schematic cross-sectional views showing a part of a process for manufacturing the light emitting device according to the first embodiment of the present invention.

Next, in the step of forming the whole-surface electrode, the whole-surface electrode 14 is formed in a predetermined region as shown in FIG. 7A. The whole-surface electrode 14 can be formed by using a lift-off method. More specifically, using a photolithography method, a resist pattern with an opening corresponding to the whole-surface electrode 14 is formed, and the above-mentioned metal film having good reflectivity, such as Ag, is deposited over the whole surface of a wafer by using a sputtering method or vapor deposition method. The resist pattern is removed to pattern the metal film, so that the whole-surface electrode 14 with openings 21 is formed.

Figure 7B:
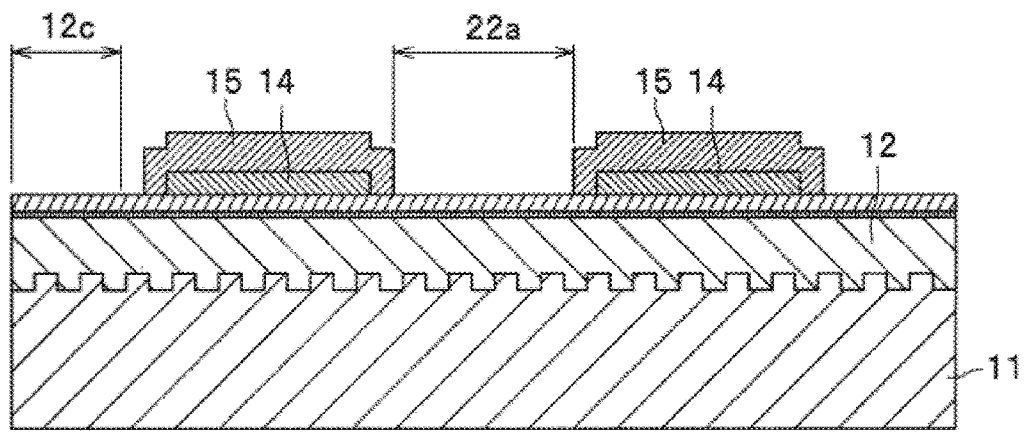
Figure 7C:
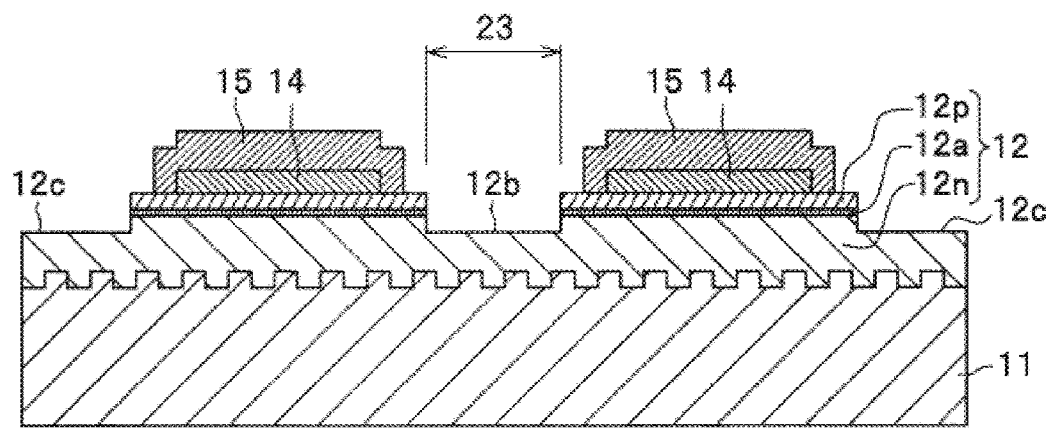

Next, in the step of forming the cover electrode, the cover electrode 15 is formed so as to cover the lateral side surfaces and the upper surface of the whole-surface electrode 14 as shown in FIG. 7B. The cover electrode 15 can be formed such that, for example, using SiN, an SiN film is deposited over the whole surface of a wafer by using a sputtering method or a deposition method, and then, by using a photolithography method, a resist pattern with an opening is formed on a region other than a region to arrange the cover electrode 15. The SiN film is then patterned by performing etching with the resist pattern as a mask, and the resist pattern is then removed to form the cover electrode 15 with the opening 22a.

Next, in the step of exposing the n-type semiconductor layer, as shown in FIG. 7C, dry etching is performed on a portion of the semiconductor layered body 12 to remove the p-type semiconductor layer 12p, the active layer 12a, and a portion of the n-type semiconductor layer 12n, to form the holes 12b and the peripheral edge portion 12c where the n-type semiconductor layer 12n is exposed.

An etching mask used in the dry etching is formed by using a photolithography method, to cover the cover electrode 15. Accordingly, the p-type semiconductor layer 12p is left with a wider area than the region for the cover electrode 15, by the thickness of the etching mask disposed on the lateral side surfaces of the cover electrode 15. In other words, the openings 23 of the p-type semiconductor layer 12p corresponding to the holes 12b (boundary lines between the holes 12b and the p-type semiconductor layer 12p) are smaller than the openings 22a of the cover electrode 15 (see FIG. 7B) by the thickness of the etching mask. In FIG. 4, the openings 23 of the p-type semiconductor layer 12p (FIG. 7C) are not included.

Figure 8A:
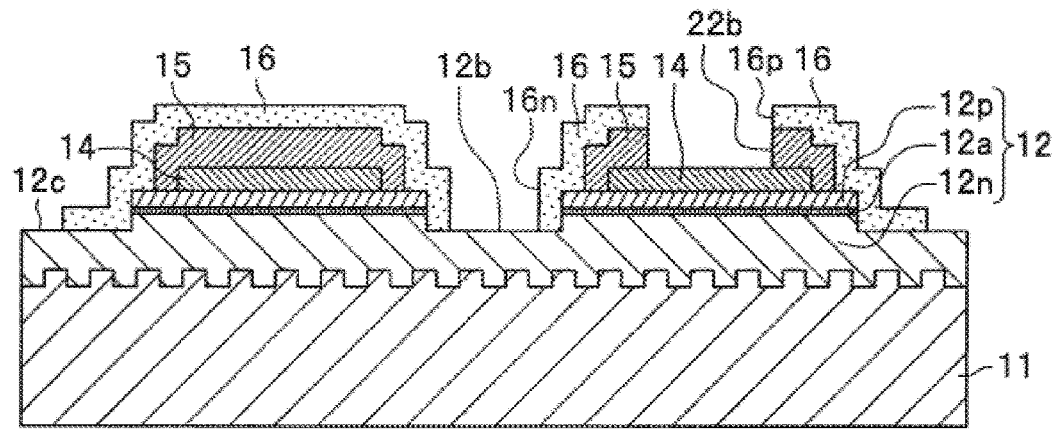
FIGS. 8A, 8B and 8C are schematic cross-sectional views showing a part of a process for manufacturing the light emitting device according to the first embodiment of the present invention.

Next, in the step of forming the insulating film, as shown in FIG. 8A, using a predetermined insulating material, the insulating film 16 is formed with the n-side openings 16n in the hole 12b and the p-side opening 16p in a part of the upper surface of the cover electrode 15. At this time, a hole is formed in the stacked layers of the insulating film 16 and the cover electrode 15 under the insulating film 16 to form the p-side opening 16p of the insulating film 16 and the opening 22b of the cover electrode 15. Therefore, the p-side opening 16p and the opening 22b have substantially the same diameter. The insulating film 16 can be formed over the whole surface of the wafer by using a sputtering method, then, a resist pattern with an opening at the above-mentioned predetermined portion is formed, and etching is performed to pattern the insulating film 16.

Figure 8B:
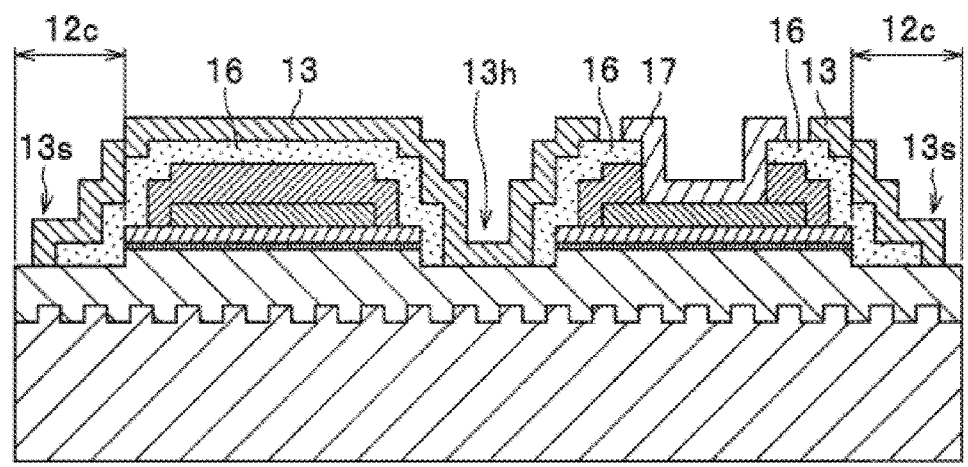

Next, in the step of forming the pad electrode, as shown in FIG. 8B, the n-side electrode 13 and the p-side electrode 17 are formed on the insulating film 16 by, for example, using a sputtering method. The n-side electrode 13 and the p-side electrode 17 can be patterned by, for example, using a lift-off method. At this time, the p-side electrode 17 is electrically connected to the whole-surface electrode 14 through the p-side opening 16p of the insulating film 16 and the opening 22b of the cover electrode 15. That is, the p-side electrode 17 is electrically connected to the p-type semiconductor layer 12p through the whole-surface electrode 14. At this time, the second n-contact portions 13h of the n-side electrode 13 are electrically connected to the n-side semiconductor layer 12n through the n-side openings 16n of the insulating film 16. Further, the first n-contact portion 13s of the n-side electrode 13 is electrically connected to the n-type semiconductor layer 12n at the peripheral edge portion 12c of the semiconductor layered body 12. On the wafer, patterning is performed so that the n-side electrode 13 is not formed in a region that serves as a cutting margin in the step of singulating on the peripheral edge portion 12c that is a boundary line between adjacent light emitting elements. Accordingly, on the wafer, the n-side electrodes 13 are formed to be separated for each of the light emitting devices. Further, a protective film for reducing damage may be formed to cover the n-side electrode 13 and the p-side electrode 17 which are pad electrodes.

Figure 8C:
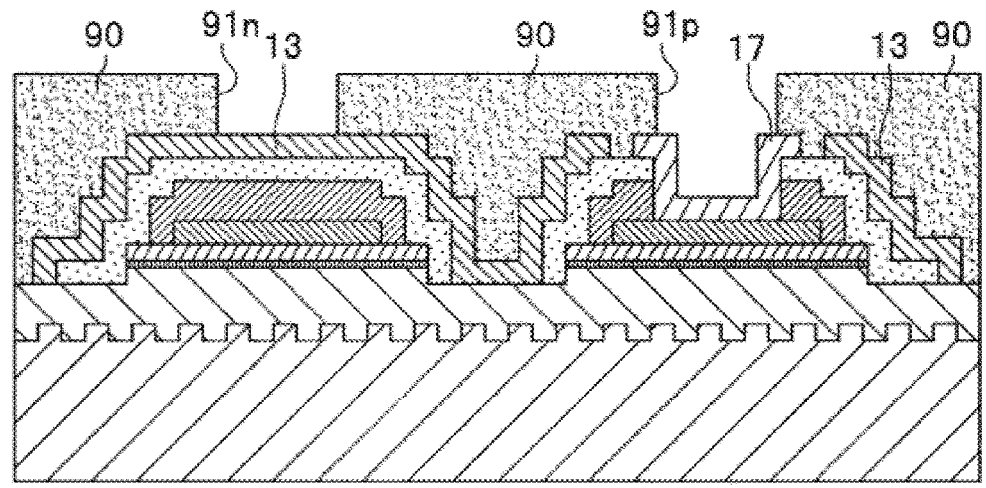

Next, in the step of forming the mask, as shown in FIG. 8C, a mask 90 is formed to cover the n-side electrode 13 and the p-side electrode 17. The mask 90 is formed using an insulating material such as a photoresist or $SiO_2$. The mask 90 is an insulating mask for preventing growth of a plating on regions where the n-side post electrode 3n and the p-side post electrode 3p are not formed in the subsequent steps. The mask 90 has openings 91n and 91p at the above-mentioned predetermined regions.

Figure 9A:
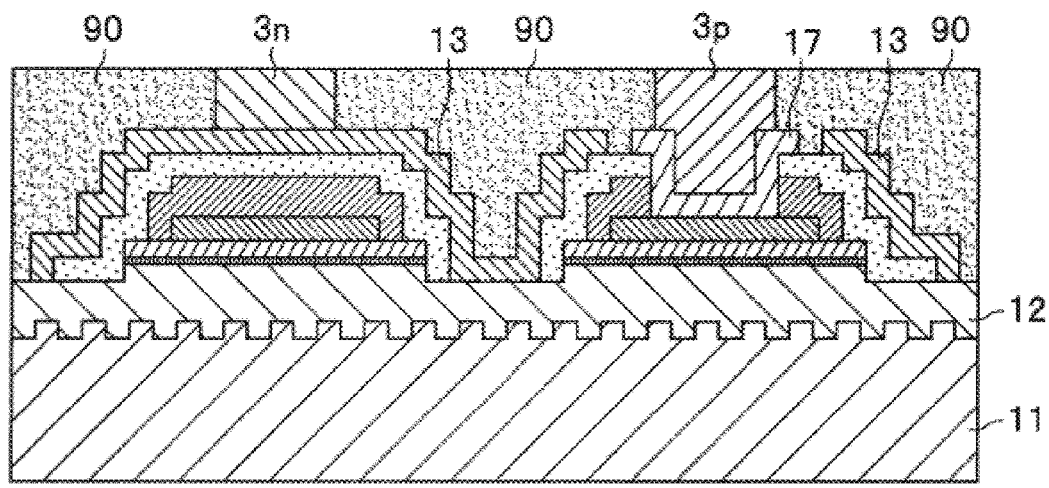
FIGS. 9A and 9B are schematic cross-sectional views showing a part of a process for manufacturing the light emitting device according to the first embodiment of the present invention.

Next, in the step of forming the post electrode, as shown in FIG. 9A, the n-side post electrode 3n and the p-side post electrode 3p are formed in the openings 91n and 91p of the mask by using an electroplating method. The n-side post electrode 3n and the p-side post electrode 3p are formed by forming a seed layer that serves as a current path in electroplating, on the n-side electrode 13 and the p-side electrode 17 that are pad electrodes, and growing a plating on the seed layer in the openings 91n and 91p of the mask.

Figure 9B:
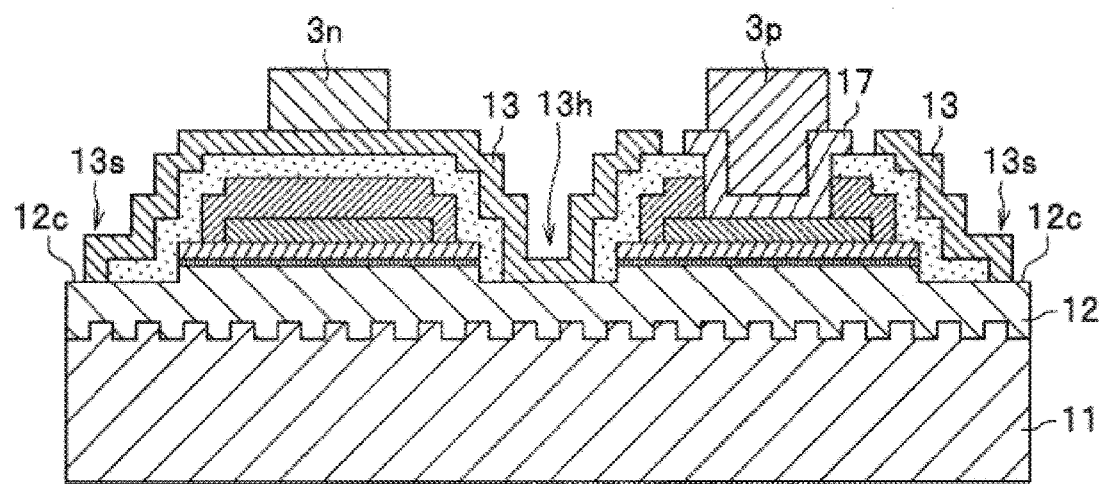

Next, in the step of removing the mask, as shown in FIG. 9B, the mask 90 is removed by using an appropriate solvent or agent. The mask 90 can also be removed by dry etching.

Next, in the step of singulating, the light emitting device 100 is singulated by cutting a wafer along the boundary lines by using a dicing method or a scribing method. The lateral side surfaces that are outer edges of the semiconductor layered body 12, formed by singulating are, as shown in FIG. 2, exposed without being covered by any of the insulating film 16, the n-side electrode 13 and the p-side electrode 17.

As described above, the light emitting device 100 according to the present embodiment has the n-side electrode 13 that includes the first n-contact portion 13s arranged to be in contact with the peripheral portion 12c of the semiconductor layered body 12 which is substantially rectangular in a plan view, and the second n-contact portions 13h arranged to be electrically in contact with the hole 12b of the n-type semiconductor layer 12n. With the first n-contact portion 13s provided in the n-side electrode 13 as described above, an increase in forward voltage Vf of the light emitting element 1 can be reduced and the light emitting output can be improved. The light emitting device 100 can maintain a light emitting intensity distribution in the light emitting surface of the light emitting element 1 by reducing the number of second n-contact portions 13h disposed on a side where the p-side post electrode 3p is arranged. Accordingly, in the light emitting device 100, an increase in forward voltage Vf of the light emitting element 1 can be reduced while maintaining a light emitting intensity distribution in the light emitting surface of the light emitting element 1.

Second Embodiment

Figure 10:
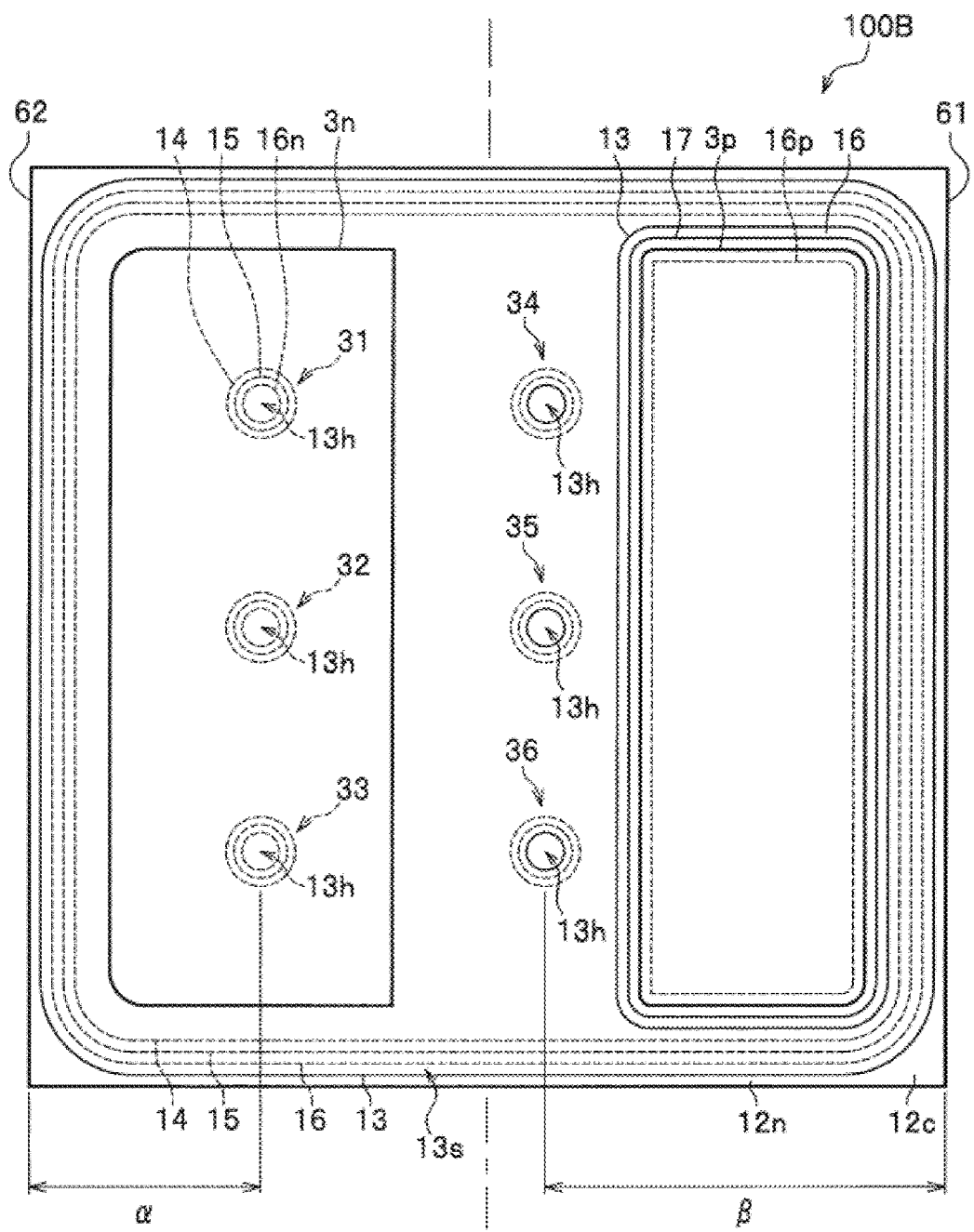
FIG. 10 is a plan view schematically showing a configuration of a light emitting device according to a second embodiment of the present invention.

As shown in FIG. 10, a light emitting device 100B according to a second embodiment is different in the shapes of the n-side electrode 13, the p-side electrode 17 and the p-side post electrode 3p, from the light emitting device 100 according to the first embodiment. Hereinafter, the same reference numerals will be applied to the configurations that are the same or similar to those the light emitting device 100 shown in FIG. 1 and descriptions thereof will be appropriately omitted.

The light emitting device 100B includes, in a plan view, a p-side post electrode 3p on the first edge 61 side of a semiconductor layered body 12, and an n-side post electrode 3n on the second edge 62 side opposite to the first edge 61 side. The p-side post electrode 3p is different from that in the light emitting device 100 shown in FIG. 1 in that the p-side post electrode 3p is formed in a substantially rectangular shape in a plan view. Further, in the light emitting device 100B, a plurality of second n-contact portions 13h are arranged only on the second edge 62 side in a plan view.

In the example shown in FIG. 10, a total of six second n-contact portions 13h are arranged in two rows in a direction substantially parallel to the first edge 61 of the semiconductor layered body 12. More specifically, in the first row, three second n-contact portions 13h are arranged on the second edge 62 side with respect to the center line shown in FIG. 10. In the present embodiment, these n-contact portions are referred to as inner-peripheral N-contacts 31, 32 and 33. In the second row, three second n-contact portions 13h are disposed near the center line shown in FIG. 10 and on the first edge 61 side. In the present embodiment, these n-contact portions are referred to as inner-peripheral N-contacts 34, 35 and 36. In the light emitting device 100B, in a plan view, a plurality of second n-contact portions 13h are arranged so as to satisfy the relationship of $\beta > \alpha$ where $\alpha$ is a distance between the inner-peripheral N-contacts 31, 32 and 33 and the second edge 62 of the semiconductor layered body 12 and $\beta$ is a distance between the inner-peripheral N-contacts 34, 35 and 36 and the first edge 61 of the semiconductor layered body 12.

In the light emitting device 100B, in a plan view, the whole of the p-side post electrode 3p is arranged between the second n-contact portion 13h arranged closest to the first edge 61 side, of all the second n-contact portions 13h and a peripheral edge portion 12c of the n-type semiconductor layer 12n at the first edge 61 side. In the example shown in FIG. 10, the whole of the p-side post electrode 3p is arranged between the inner-peripheral N-contacts 34, 35 and 36 and the first edge 61 of the semiconductor layered body 12.

In the light emitting device 100B, the p-side post electrode 3p is formed in a substantially rectangular shape in a plan view, and an n-side electrode 13 is disposed to surround the periphery of the p-side electrode 17. The n-side electrode 13 includes a first n-contact portion 13s arranged in contact with the peripheral edge portion 12c of the semiconductor layered body 12 that is substantially rectangular in a plan view, and the second n-contact portions 13h arranged in contact with the n-type semiconductor layer 12n through the respective n-side openings 16n, similar to that in the first embodiment. A method of manufacturing the light emitting device 100B is similar to the above-described method, and therefore the descriptions thereof are appropriately omitted.

In the light emitting device 100B according to the present embodiment, the first n-contact portion 13s is arranged in the n-side electrode 13, so that an increase in forward voltage Vf of a light emitting element 1 can be reduced and the light emitting output can be improved. Further, in the light emitting device 100B, in a plan view, a plurality of n-contact portions 13h are arranged on the n-side post electrode 3n side (in the left in FIG. 10), and thus the area of the substantially rectangular p-side post electrode 3p can be easily reliably obtained, so that mountability can be improved while maintaining the light emitting intensity distribution in the light emitting surface of the light emitting element 1. Accordingly, in the light emitting device 100B, an increase in forward voltage Vf of the light emitting element 1 can be reduced while maintaining the light emitting intensity distribution in the light emitting surface of the light emitting element 1.

Third Embodiment

Figure 11:
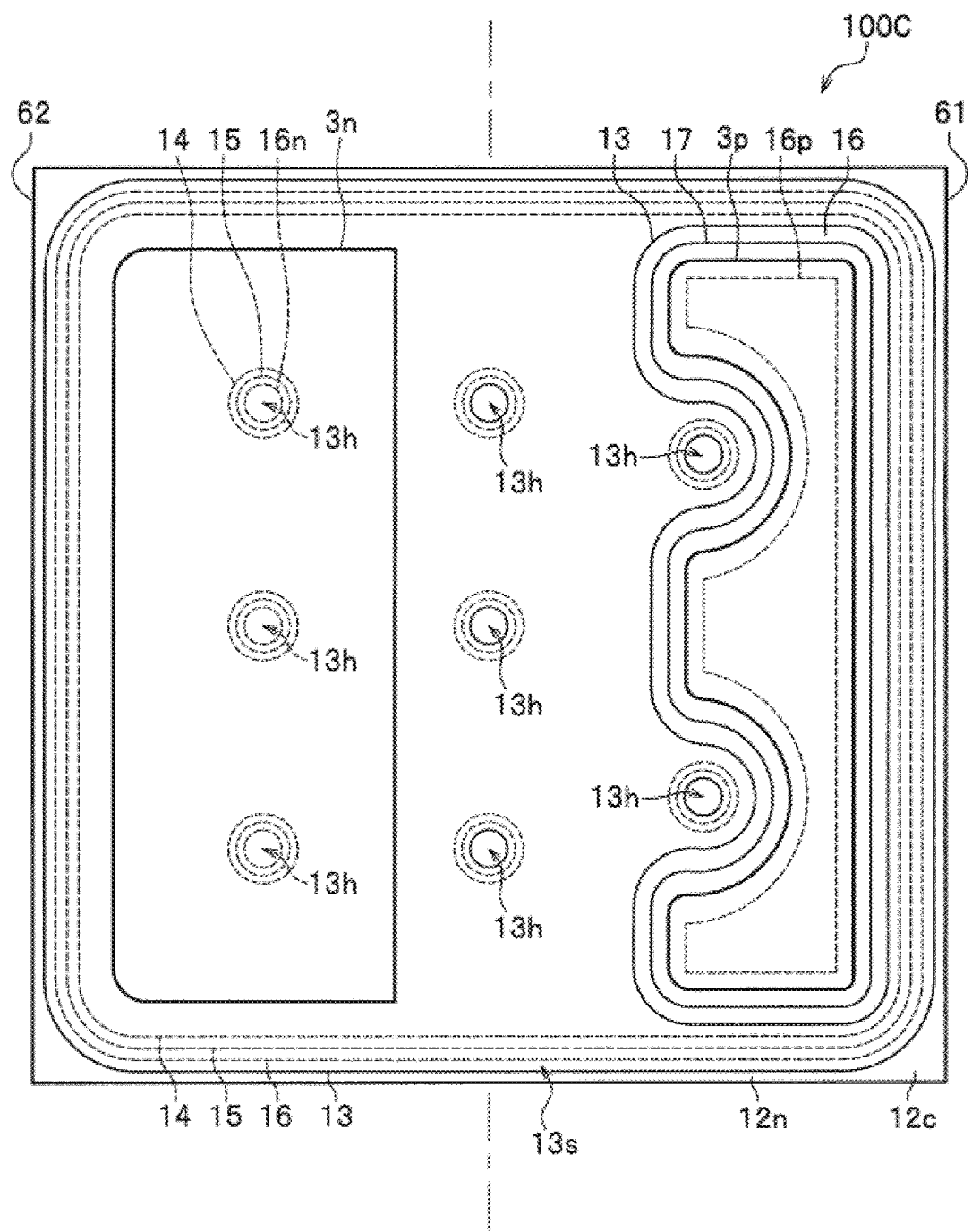
FIG. 11 is a plan view schematically showing a configuration of a light emitting device according to a third embodiment of the present invention.

As shown in FIG. 11, a light emitting device 100C according to a third embodiment is different in the number and arrangement of the second n-contact portions 13h and the shape of the p-side post electrode 3p, from the light emitting device 100 according to the first embodiment. Hereinafter, the same reference numerals will be applied to the configurations that are the same or similar to those the light emitting device 100 shown in FIG. 1 and descriptions thereof will be appropriately omitted.

In the light emitting device 100C, a total of eight second n-contact portions 13h are arranged in three rows in a direction substantially parallel to the first edge 61 of a semiconductor layered body 12. More specifically, three second n-contact portions 13h are disposed along the center line of the semiconductor layered body 12, two second n-contact portions 13h are disposed on the first edge 61 side, and three second n-contact portions 13h are disposed on the second edge 62 side. The light emitting device 100C according to the third embodiment is particularly preferable than the light emitting device 100 according to the first embodiment, in the case of forming a substantially square shape with a smaller side in a plan view, and an effect comparable to that of the light emitting device 100 according to the first embodiment can be exhibited.

Fourth Embodiment

Figure 12:
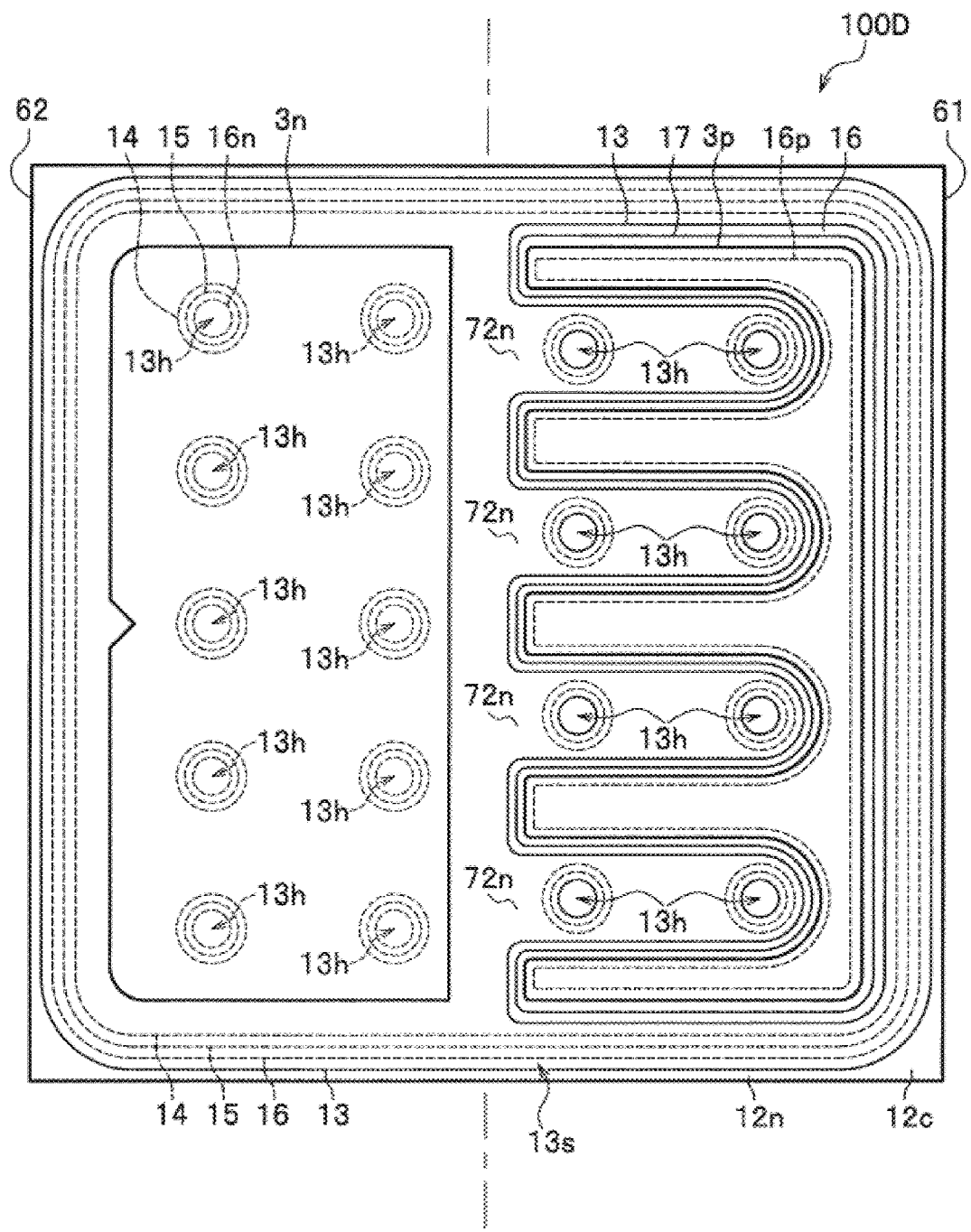
FIG. 12 is a plan view schematically showing a configuration of a light emitting device according to a fourth embodiment of the present invention.

As shown in FIG. 12, a light emitting device 100D according to a fourth embodiment is different in the number and arrangement of second n-contact portions 13h and the shape of the p-side post electrode 3p, from the light emitting device 100 according to the first embodiment. Hereinafter, the same reference numerals will be applied to the configurations that are the same or similar to those the light emitting device 100 shown in FIG. 1 and descriptions thereof will be appropriately omitted.

In the light emitting device 100D, a total of eighteen second n-contact portions 13h are arranged in four rows along a direction substantially parallel to the first edge 61 of a semiconductor layered body 12. More specifically, in FIG. 12, five second n-contact portions 13h are arranged respectively in the left-most row (first row) and its adjacent row (second row), and four second n-contact portions 13h are arranged respectively in the other rows (third row and fourth row). The first row and the second row are arranged on the second edge 62 side with respect to the center line of the semiconductor layered body 12, and the third row and the fourth row are arranged on the first edge 61 side with respect to the center line of the semiconductor layered body 12. In the fourth embodiment, the second n-contact portions 13h are arranged at not only on the tip portion but on also other portions of each of the extended portions 72n of the n-side electrode 13. The light emitting device 100D according to the fourth embodiment is particularly preferable than the light emitting device 100 according to the first embodiment, in the case of forming a substantially square shape with a larger side in a plan view, and an effect comparable to that of the light emitting device 100 according to the first embodiment can be exhibited.

The light emitting device according to certain embodiments of the present invention has been described in detail above by way of the mode for carrying out the invention, but the spirit of the present invention is not limited thereto, and should be broadly construed on the basis of claims. Various changes and modifications made on the basis of these descriptions are included as a matter of course.

Hereinafter, other modifications will be described. For example, the n-side post electrode 3n and the p-side post electrode 3p of the light emitting device 100 may have a layered structure formed using a plurality of metals. In particular, at least the uppermost layer of each of the n-side post electrode 3n and the p-side post electrode 3p with the upper surface being a mounting surface are preferably made of Au to reduce corrosion and to improve the bonding to a mounting substrate when an Au alloy-based bonding member such as Au—Sn eutectic solder is used. In the case where the lower layer portion of each of the n-side post electrode 3n and the p-side post electrode 3p is made of a metal other than Au, such as Cu, the upper layer portion may have a layered structure such as a structure of Ni/Au or Ni/Pd/Au, to enhance adhesion with Au. Further, the upper surface of each of the n-side post electrode 3n and the p-side post electrode 3p may have an irregularity shape.

In the light emitting device 100, the thickness of the substrate 11 may be reduced by polishing. Also, a fluorescent material layer may be formed on the back surface of the substrate 11, with using a resin that contains a fluorescent material. In the light emitting element 1, the size and shape of the p-side opening 16p of the insulating film 16 other than those illustrated in the embodiments described above may be employed, and a plurality of p-side openings may be formed in the insulating film 16.

The size and shape of the p-side opening 16n of the insulating film 16, i.e. the size and shape of the second n-contact portion 13h, other than those illustrated in the embodiments described above may be employed, and second n-contact portions 13h having different sizes and shapes may also be included.

EXAMPLES

The following experiments were conducted for examining the performance of the light emitting device according to certain embodiments of the present invention. A light emitting device having the same shape as that of the light emitting device 100 according to the first embodiment (hereinafter, referred to as Example 1) was manufactured. Materials used for manufacture of the light emitting device of Example 1 are as follows.

Example 1

For a substrate 11, sapphire was used. Each of the GaN-based semiconductors were grown on the substrate 11 to form an n-type semiconductor layer 12n, an active layer 12a and a p-type semiconductor layer 12p. A whole-surface electrode 14 was formed by sequentially depositing an Ag layer, a Ni layer, a Ti layer and a Pt layer in this order respectively with a predetermined thickness over almost the whole surface of the p-type semiconductor layer 12p. A cover electrode 15 was formed by insulating SiN to cover the whole-surface electrode 14. Holes 12b and a peripheral edge portion 12c of the n-type semiconductor layer 12n were formed by removing corresponding portions of the p-type semiconductor layer 12p, the active layer 12a, and a portion of the n-type semiconductor layer 12n by using reactive ion etching (RIE). An insulating film 16 was formed using $SiO_2$. An n-side electrode 13 and a p-side electrode 17 were formed by stacking Ti, ASC (Al, Si, Cu), Ti, Pt, Au, and Ti in this order in the same step of manufacturing. A protective film was formed on the n-side electrode 13 and the p-side electrode 17 using $SiO_2$. Seed layers were formed in a region for an n-side post electrode 3n and a p-side post electrode 3p by sequentially stacking Ti, Ni, and Au in this order. The n-side post electrode 3n and the p-side post electrode 3p were formed by Cu plating. The thickness of the substrate 11 was reduced by polishing before singulating.

The conditions of the members for forming the light emitting device of Example 1 are as below.

Planar dimensions of light emitting device: 1.0 mm×1.0 mm

Width of peripheral edge portion of semiconductor layered body: 55 μm

Half-width of boundary regions (dicing streets) between light emitting elements 1 on wafer: 25 μm Diameter of second n-contact portion (diameter of n-side opening): ϕ=40 μm The conditions of second n-contact portions in the light emitting device of Example 1 are as below.

Number of second n-contact portions: 11

Arrangement of second n-contact portions: as in FIG. 1, the light emitting device of Example 1 includes three second n-contact portions 13h on the first edge 61 side and four second n-contact portions 13h on the second edge 62 side. In other words, the light emitting device of Example 1 is configured such that, in a plan view, the number of second n-contact portions 13h arranged on the right in FIG. 1 is smaller than the number of second n-contact portions 13h arranged on the left in FIG. 1.

Evaluation of Forward Voltage Characteristics and Optical Output Characteristics In order to evaluate improvement in forward voltage Vf and optical output Po of the light emitting device of Example 1, a light emitting device absent of the first n-contact portion 13s was manufactured as Comparative Example 1 in the same manner as in Example 1. The forward voltage Vf and the optical output Po of the light emitting devices of Comparative Example 1 and Example 1 were measured under predetermined conditions. About 0.04 V lower forward voltage Vf was achieved with the light emitting device of Example 1 compared to that of Comparative Example 1. Also, about 0.2% higher optical output Po was achieved with the light emitting device of Example 1 compared to that of Comparative Example 1.

Evaluation of Light Emission Intensity Distribution

In order to evaluate improvement in light emission intensity distribution of the light emitting device of Example 1, a light emitting device that includes the first n-contact portion 13s and has the same number of second n-contact portions 13h arranged on the left and on the right in a plan view in FIG. 1 was manufactured as Comparative Example 2. More specifically, the light emitting device of Comparative Example 2 was manufactured in the same manner as Example 1 except that a total of twelve second n-contact portions 13h were employed and of those, four second n-contact portions 13h were arranged on the first edge 61 side (right in FIG. 1). In Comparative Example 2, in order to maintain mountability of the light emitting device, the planar dimensions of the region to arrange the p-side post electrode 3p was made equivalent to that in Example 1 with narrowing a portion of each extended portion 72n of the n-side electrode 13.

Figure 14:
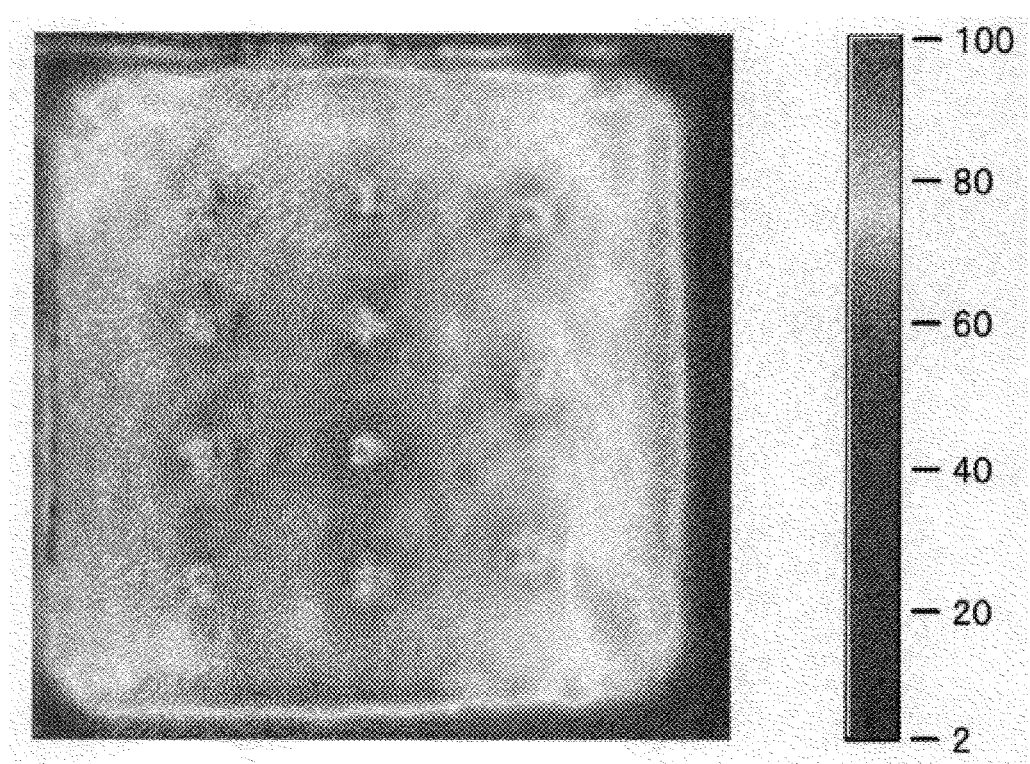
FIG. 14 is a view showing one example of a light emitting intensity distribution in the light emitting device according to the first embodiment of the present invention.
Figure 15:
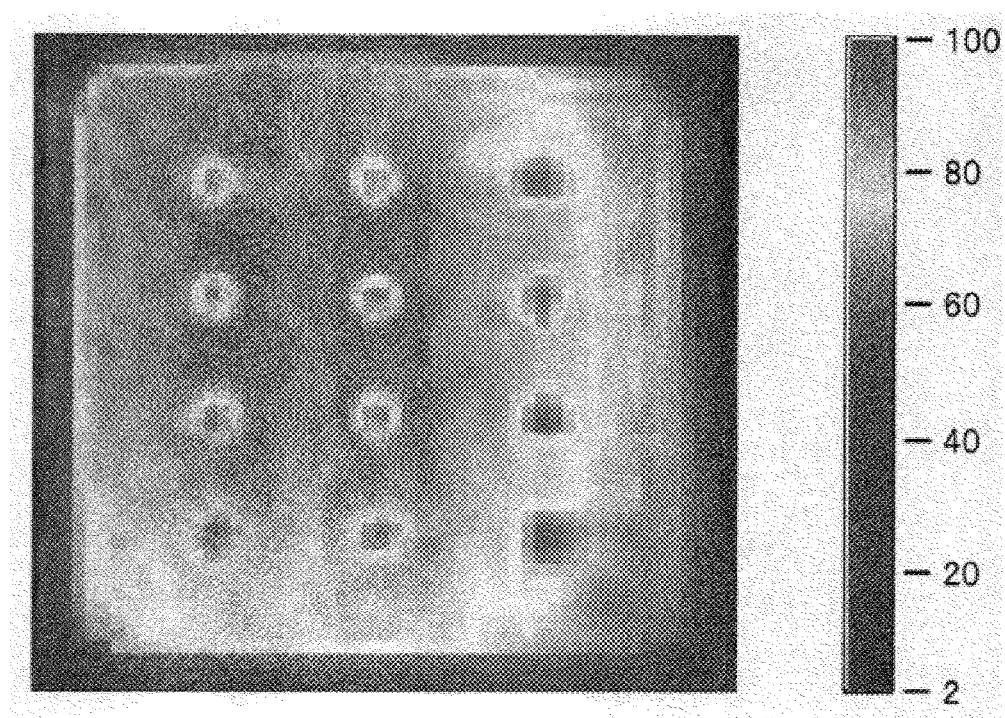
FIG. 15 is a view showing one example of a light emitting intensity distribution in a light emitting device in a comparative example.

The light emitting intensity distribution of Comparative Example 2 and Example 1 were measured under predetermined conditions. FIG. 14 shows the result of Example 1, and FIG. 15 shows the result of Comparative Example 2. In FIG. 14 and FIG. 15, the scale at the right side of the light emitting devices shows a corresponding relationship between the value and the hue of the light of the light emitting intensity. A light emitting intensity with a higher value is represented by a color of a longer wavelength. For example, the colors respectively correspond to the values of blue as 2, green as 40, yellowish green as 60, orange as 80 and red as 100. Of those colors, the lightest color of yellow corresponds to 75. The next lightest color to yellow is orange, and the next lightest color to orange is yellowish green.

As shown in FIG. 14 and FIG. 15, both the light emitting devices exhibit blue color with high density at the peripheral edge portions. Also, the color in the vicinity of four second n-contact portions 13h arranged along the center line is red color with high density in both the light emitting devices. That is, it was confirmed that in both the light emitting devices, the light emitting intensity in the vicinity of four second n-contact portions 13h arranged along the center line in a plan view was the highest, and the light emitting intensity was gradually decreased toward the peripheral edge portion 12c of the semiconductor layered body 12. Further, as shown in FIG. 15, in the light emitting device of Comparative Example 2, the light emitting intensity on the p-side post electrode 3p side (right in FIG. 15) was lower than the n-side post electrode 3n side (left in FIG. 15). In other words, the light emission of the light emitting device of Comparative Example 2 had an intensity distribution asymmetrical on the left and the right in a plan view.

In contrast, measurement of the light emitting intensity distribution of the light emitting device of Example 1 showed that the light emitting intensity on the p-side post electrode 3p side (right in FIG. 14) was higher than that in Comparative Example 2 as shown in FIG. 14. In other words, in the light emission of the light emitting device of Example 1, in a plan view, asymmetry intensity distribution on the left and the right was reduced and is improved to achieve an intensity distribution more symmetrical on the left and the right. From the experiments described above, it has been confirmed that in the light emitting device of Example 1, the light emitting intensity distribution in the surface of the light emitting element 1 is maintained, and also the light emitting output is improved while reducing an increase in forward voltage Vf of the light emitting element 1.

It is to be understood that although the present invention has been described with regard to embodiments described above, various other embodiments and variants may occur to those skilled in the art, which are within the scope and spirit of the invention, and such other embodiments and variants are intended to be covered by the following claims.

What is claimed is:

1. A light emitting device comprising:
    a light emitting element including a semiconductor layered body, an insulating film, an n-side electrode, and a p-side electrode;
    a p-side post electrode; and
    an n-side post electrode,
    wherein the semiconductor layered body is substantially rectangular in a plan view and includes:
        an n-type semiconductor layer; and
        a p-type semiconductor layer disposed in a region that excludes a peripheral edge portion of the n-type semiconductor layer and a portion within a region that is interior to the peripheral edge portion,
    the insulating film is disposed on the semiconductor layered body and includes at least one p-side opening disposed on the p-type semiconductor layer, and a plurality of n-side openings disposed on the n-type semiconductor layer at the portion within the region interior to the peripheral edge portion,
    the n-side electrode is disposed so as to extend from the top of the insulating film to the peripheral edge portion of the n-type semiconductor layer and includes a first n-contact portion electrically connected to the n-type semiconductor layer at the peripheral edge portion and a plurality of second n-contact portions electrically connected to the n-type semiconductor layer through the plurality of n-side openings,
    the p-side electrode is electrically connected to the p-type semiconductor layer through the at least one p-side opening;
    the p-side post electrode and at least one of the plurality of second n-contact portions are disposed on a side of a first edge of the semiconductor layered body in the plan view, and the p-side post electrode is disposed on the p-side electrode and electrically connected to the p-side electrode,
    the n-side post electrode and at least one of the second n-contact portions are disposed on a side of a second edge opposite to the first edge side in the plan view, and the n-side post electrode is disposed on the n-side electrode and electrically connected to the plurality of second n-contact portions, and
    the number of the at least one of the plurality of second n-contact portions disposed on the first edge side is smaller than the number of the at least one of the plurality of second n-contact portions disposed on the second edge side in the plan view.

2. The light emitting device according to claim 1, wherein the n-side electrode includes:
    an n-side comb-shaped portion that includes the plurality of second n-contact portions and is disposed in a comb shape from the second edge side toward the first edge side of the semiconductor layered body; and
    a peripheral wall portion that the first n-contact portion and is disposed continuously from the n-side comb-shaped portion so as to surround the p-side post electrode in the plan view.

3. The light emitting device according to claim 2, wherein the n-side comb-shaped portion includes:
    a base portion disposed parallel to the first edge of the semiconductor layered body; and
    a plurality of extended portions which extend from the base portion toward the first edge side and are electrically connected to the n-type semiconductor layer through the at least one of the plurality of second n-contact portions disposed on the first edge side, wherein the plurality of extended portions have substantially uniform widths.

4. The light emitting device according to claim 3, wherein the plurality of extended portions are disposed at equal intervals in a direction parallel to the first edge of the semiconductor layered body in the plan view.

5. The light emitting device according to claim 4, wherein the widths of the plurality of the extended portions are $\frac{1}{100}$ to $\frac{1}{3}$ of the length of the semiconductor layered body in a direction parallel to the first edge.

6. The light emitting device according to claim 3, wherein the plurality of extended portions have the same shape in the plan view.

7. The light emitting device according to claim 3, wherein the widths of the plurality of extended portions are $\frac{1}{100}$ to $\frac{1}{3}$ of the length of the semiconductor layered body in a direction parallel to the first edge.

8. The light emitting device according to claim 2, wherein the first n-contact portion is formed in a substantially rectangular ring shape.

9. The light emitting device according to claim 2, wherein two or more of the plurality of second n-contact portions are disposed on the first edge side.

10. The light emitting device according to claim 1, wherein the diameters of the plurality of n-side openings are in a range of 3 µm to 150 µm.

11. The light emitting device according to claim 1, wherein the first n-contact portion is formed in a substantially rectangular ring shape.

12. The light emitting device according to claim 1, wherein two or more of the plurality of second n-contact portions are disposed on the first edge side.

13. A light emitting device comprising:
a light emitting element including a semiconductor layered body, an insulating film, an n-side electrode, and a p-side electrode;
a p-side post electrode; and
an n-side post electrode,
wherein the semiconductor layered body is substantially rectangular in a plan view and includes:
an n-type semiconductor layer; and
a p-type semiconductor layer disposed in a region that excludes a peripheral edge portion of the n-type semiconductor layer and a portion within a region of the n-type semiconductor layer that is interior to the peripheral edge portion,
the insulating film is disposed on the semiconductor layered body and includes at least one p-side opening disposed on the p-type semiconductor layer, and a plurality of n-side openings disposed on the n-type semiconductor layer at the portion within the region interior to the peripheral edge portion,
the n-side electrode is disposed so as to extend from the top of the insulating film to the peripheral edge portion of the n-type semiconductor layer and includes a first n-contact portion electrically connected to the n-type semiconductor layer at the peripheral edge portion and a plurality of second n-contact portions electrically connected to the n-type semiconductor layer through the plurality of n-side openings,
the p-side electrode is electrically connected to the p-type semiconductor layer through the at least one p-side opening,
the p-side post electrode and at least one of the plurality of second n-contact portions are disposed on a side of a first edge of the semiconductor layered body in the plan view, and the p-side post electrode is disposed on the p-side electrode and electrically connected to the p-side electrode, and
the n-side post electrode and at least one of the plurality of second n-contact portions are disposed on a side of a second edge opposite to the first edge side in the plan view, and the n-side post electrode is disposed on the n-side electrode and electrically connected to the plurality of second n-contact portions,
the plurality of the second n-contact portions are arranged so as to satisfy the relationship of $\beta > \alpha$ where $\alpha$ is a distance between a second n-contact portion closest to the first edge and the second edge of the semiconductor layered body, and $\beta$ is a distance between a second n-contact portion closest to the second edge and the first edge of the semiconductor layered body, and
the whole of the p-side post electrode is arranged between the second n-contact portion closest to the first edge and the peripheral edge portion.

14. The light emitting device according to claim 13, wherein the p-side electrode is formed in a substantially rectangular shape in the plan view, and the n-side electrode is disposed surrounding the p-side electrode.

15. The light emitting device according to claim 14, wherein the diameters of the plurality of n-side openings are in a range of 3 µm to 150 µm.

16. The light emitting device according to claim 14, wherein the first n-contact portion is formed in a substantially rectangular ring shape.

17. The light emitting device according to claim 14, wherein two or more of the second n-contact portions are disposed respectively on the first edge side and the second edge side.

18. The light emitting device according to claim 13, wherein the first n-contact portion is formed in a substantially rectangular ring shape.

19. The light emitting device according to claim 13, wherein two or more of the plurality of second n-contact portions are disposed respectively on the first edge side and the second edge side.

* * * * *